US008335973B2

(12) United States Patent
Abe

(10) Patent No.: US 8,335,973 B2
(45) Date of Patent: Dec. 18, 2012

(54) PROCESSING MODULE, ERROR CORRECTION DECODING CIRCUIT, AND PROCESSING METHOD FOR ERROR LOCATOR POLYNOMIAL

(75) Inventor: Nobuo Abe, Tokyo (JP)

(73) Assignee: Hitachi, Ltd., Tokyo (JP)

(*) Notice: Subject to any disclaimer, the term of this patent is extended or adjusted under 35 U.S.C. 154(b) by 1007 days.

(21) Appl. No.: 12/340,245

(22) Filed: Dec. 19, 2008

(65) Prior Publication Data

US 2009/0187812 A1 Jul. 23, 2009

(30) Foreign Application Priority Data

Jan. 17, 2008 (JP) ................................ 2008-008425

(51) Int. Cl.
*H03M 13/15* (2006.01)
*H03M 13/00* (2006.01)
(52) U.S. Cl. ........ 714/782; 714/781; 714/783; 714/784; 714/785
(58) Field of Classification Search ................... 714/782
See application file for complete search history.

(56) References Cited

U.S. PATENT DOCUMENTS

| | | | | |
|---|---|---|---|---|
| 4,833,678 | A * | 5/1989 | Cohen | 714/781 |
| 5,699,368 | A * | 12/1997 | Sakai et al. | 714/757 |
| 6,304,994 | B1 * | 10/2001 | Oh et al. | 714/784 |
| 6,487,691 | B1 * | 11/2002 | Katayama et al. | 714/784 |
| 6,732,325 | B1 * | 5/2004 | Tash et al. | 714/785 |

FOREIGN PATENT DOCUMENTS

| | | |
|---|---|---|
| JP | 05-165662 | 7/1993 |
| JP | 07-240692 | 9/1995 |

OTHER PUBLICATIONS

"ITU-T Recommendation G.709/Y.1331 Interfaces for the Optical Transport Network" International Telecommunication Union Mar. 2003, pp. 24-25.
"ITU-T Recommendation G.975.1 Forward Error Correction for High bit Rate DWDM Submarine Systems" International Telecommunication Union Feb. 2004, pp. 15-20.

* cited by examiner

*Primary Examiner* — Albert Decady
*Assistant Examiner* — Justin R Knapp
(74) *Attorney, Agent, or Firm* — McDermott Will & Emery LLP

(57) ABSTRACT

A Euclid processing module for obtaining an error locator polynomial of a binary BCH code in an error correction decoding circuit, in which error corrections of words are performed, includes registers, a shifter, a zero insertion unit, selectors and a sequencer. Coefficients of polynomials $R_i(z)$ and $B_i(z)$ stored in the registers are subjected to Galois field calculations by the processing module. Results of the calculations and the data of the registers are shifted by the shifter. Some of the coefficients are erased by the zero insertion unit and stored in registers by controlling the selectors with the sequencer. A necessary polynomial $\sigma(z)$ is calculated by repeated processing of the processing module. The Euclid processing module decreases a logic scale and simplifies controlling logic in a state of small latency and high operating frequency.

11 Claims, 26 Drawing Sheets

S(z): SYNDROME POLYNOMIAL  σ(z): ERROR LOCATOR POLYNOMIAL  R10₂ₜ: VALUE OF #2t IN REGISTER 10

PRIOR ART

| ELEMENT | INVERSE ELEMENT | ELEMENT | INVERSE ELEMENT |
|---|---|---|---|
| 0 | - | $\alpha_{07}$ | $\alpha_{08}$ |
| $T(\alpha_{00})$ | $T(\alpha_{00})$ | $\alpha_{08}$ | $\alpha_{07}$ |
| $\alpha_{01}$ | $\alpha_{14}$ | $\alpha_{09}$ | $\alpha_{06}$ |
| $\alpha_{02}$ | $\alpha_{13}$ | $\alpha_{10}$ | $\alpha_{05}$ |
| $\alpha_{03}$ | $\alpha_{12}$ | $\alpha_{11}$ | $\alpha_{04}$ |
| $\alpha_{04}$ | $\alpha_{11}$ | $\alpha_{12}$ | $\alpha_{03}$ |
| $\alpha_{05}$ | $\alpha_{10}$ | $\alpha_{13}$ | $\alpha_{02}$ |
| $\alpha_{06}$ | $\alpha_{09}$ | $\alpha_{14}$ | $\alpha_{01}$ |

FIG. 11

FIRST DIVISION  $R_6(z) \div_g R_5(z) = Q_0(z)$ WITH REMAINDER $R_4(z)$ $R_5(z) = S(z)$ $\overbrace{\alpha_{02}z^5 + \alpha_{10}z^4 + \alpha_{02}z^3 + \alpha_{01}z^2 + \alpha_{01}z + \alpha_{08}}$ $\Big) \begin{array}{l} \alpha_{13}z + \alpha_{06} \\ \overline{z^6 \text{---------------------------------------} \to R_6(z)} \\ z^6 + \alpha_{08}z^5 + \alpha_{00}z^4 + \alpha_{14}z^3 + \alpha_{14}z^2 + \alpha_{06}z \\ \overline{\alpha_{08}z^5 + \alpha_{00}z^4 + \alpha_{14}z^3 + \alpha_{14}z^2 + \alpha_{06}z} \\ \alpha_{08}z^5 + \alpha_{01}z^4 + \alpha_{08}z^3 + \alpha_{07}z^2 + \alpha_{07}z + \alpha_{14} \\ \overline{\alpha_{04}z^4 + \alpha_{06}z^3 + \alpha_{01}z^2 + \alpha_{10}z + \alpha_{14}} \text{---} \to R_4(z) \end{array}$ SECOND DIVISION  $R_5(z) \div_g R_4(z) = Q_1(z)$ WITH REMAINDER $R_3(z)$ $R_4(z)$ $\overbrace{\alpha_{04}z^4 + \alpha_{06}z^3 + \alpha_{01}z^2 + \alpha_{10}z + \alpha_{14}}$ $\Big) \begin{array}{l} \alpha_{13}z + \alpha_{13} \\ \alpha_{02}z^5 + \alpha_{10}z^4 + \alpha_{02}z^3 + \alpha_{01}z^2 + \alpha_{01}z + \alpha_{08} \text{---} \to R_5(z) \\ \alpha_{02}z^5 + \alpha_{04}z^4 + \alpha_{14}z^3 + \alpha_{08}z^2 + \alpha_{12}z + \\ \overline{\alpha_{02}z^4 + \alpha_{13}z^3 + \alpha_{10}z^2 + \alpha_{13}z + \alpha_{08}} \\ \alpha_{02}z^4 + \alpha_{04}z^3 + \alpha_{14}z^2 + \alpha_{08}z + \alpha_{12} \\ \overline{\alpha_{11}z^3 + \alpha_{11}z^2 + \alpha_{03}z + \alpha_{09}} \text{---} \to R_3(z) \end{array}$ THIRD DIVISION  $R_4(z) \div_g R_3(z) = Q_2(z)$ WITH REMAINDER $R_2(z)$ $R_3(z)$ $\overbrace{\alpha_{11}z^3 + \alpha_{11}z^2 + \alpha_{03}z + \alpha_{09}}$ $\Big) \begin{array}{l} \alpha_{08}z + \alpha_{01} \\ \alpha_{04}z^4 + \alpha_{06}z^3 + \alpha_{01}z^2 + \alpha_{10}z + \alpha_{14} \text{---} \to R_4(z) \\ \alpha_{04}z^4 + \alpha_{04}z^3 + \alpha_{11}z^2 + \alpha_{02}z \\ \overline{\alpha_{12}z^3 + \alpha_{06}z^2 + \alpha_{04}z + \alpha_{14}} \\ \alpha_{12}z^3 + \alpha_{12}z^2 + \alpha_{04}z + \alpha_{14} \\ \overline{\alpha_{04}z^2 + 0\,z + \alpha_{11}} \text{---} \to R_2(z) \end{array}$

FIG. 18

FIRST COMPUTATION $B_{-1}(z)+Q_0(z)B_0(z)=B_1(z)$ $$\underbrace{0}_{B_{-1}(z)} + \underbrace{(\alpha_{13}z^1+\alpha_{06})}_{Q_0(z)} \underbrace{1}_{B_0(z)}$$

$= 0 + \alpha_{13}z^1 + \alpha_{06}$ $= \underbrace{\alpha_{13}z^1 + \alpha_{06}}_{B_1(z)}$

---

SECOND COMPUTATION $B_0(z)+Q_1(z)B_1(z)=B_2(z)$ $$\underbrace{1}_{B_0(z)} + \underbrace{(\alpha_{13}z^1+\alpha_{13})}_{Q_1(z)} \underbrace{(\alpha_{13}z^1+\alpha_{06})}_{B_1(z)}$$

$= 1 + \alpha_{13}z^1(\alpha_{13}z^1+\alpha_{06}) + \alpha_{13}(\alpha_{13}z^1+\alpha_{06})$ $= 1 + (\alpha_{11}z^2+\alpha_{04}z^1) + \alpha_{13}(\alpha_{13}z^1+\alpha_{06})$ $= (\alpha_{11}z^2+\alpha_{04}z^1+1) + \alpha_{13}(\alpha_{13}z^1+\alpha_{06})$ $= (\alpha_{11}z^2+\alpha_{04}z^1+1) + (\alpha_{11}z^1+\alpha_{04})$ $= \underbrace{\alpha_{11}z^2+\alpha_{13}z^1+\alpha_{01}}_{B_2(z)}$

---

THIRD COMPUTATION $B_1(z)+Q_2(z)B_2(z)=B_3(z)$ $$\underbrace{(\alpha_{13}z^1+\alpha_{06})}_{B_1(z)} + \underbrace{(\alpha_{06}z^1+\alpha_{01})}_{Q_2(z)} \underbrace{(\alpha_{11}z^2+\alpha_{13}z^1+\alpha_{01})}_{B_2(z)}$$

$= (\alpha_{13}z^1+\alpha_{06}) + \alpha_{06}z^1(\alpha_{11}z^2+\alpha_{13}z^1+\alpha_{01}) + \alpha_{01}(\alpha_{11}z^2+\alpha_{13}z^1+\alpha_{01})$ $= (\alpha_{13}z^1+\alpha_{06}) + (\alpha_{04}z^3+\alpha_{06}z^2+\alpha_{09}z^1) + \alpha_{01}(\alpha_{11}z^2+\alpha_{13}z^1+\alpha_{01})$ $= (\alpha_{04}z^3+\alpha_{06}z^2+\alpha_{10}z^1+\alpha_{06}) + \alpha_{01}(\alpha_{11}z^2+\alpha_{13}z^1+\alpha_{01})$ $= (\alpha_{04}z^3+\alpha_{06}z^2+\alpha_{10}z^1+\alpha_{06}) + (\alpha_{12}z^2+\alpha_{14}z^1+\alpha_{02})$ $= \underbrace{\alpha_{04}z^3+\alpha_{04}z^2+\alpha_{11}z^1+\alpha_{03}}_{B_3(z)}$

FIG.19

FIRST STEP $R_6(z) \div_g R_5(z) = Q_0(z)$ WITH REMAINDER $R_4(z)$ FIRST HALF $R_5(z) = S(z)$ $\alpha_{13}z$ $(\alpha_{02}z^5 + \alpha_{10}z^4 + \alpha_{02}z^3 + \alpha_{01}z^2 + \alpha_{01}z + \alpha_{08})\overline{\big)\, z^6 \text{-----------------------------------} \rightarrow R_6(z)}$ $\phantom{(\alpha_{02}z^5 + \alpha_{10}z^4 + \alpha_{02}z^3 + \alpha_{01}z^2 + \alpha_{01}z + \alpha_{08})\big)\,} z^6 + \alpha_{08}z^5 + \alpha_{00}z^4 + \alpha_{14}z^3 + \alpha_{14}z^2 + \alpha_{06}z$ $\phantom{(\alpha_{02}z^5 + \alpha_{10}z^4 + \alpha_{02}z^3 + \alpha_{01}z^2 + \alpha_{01}z + \alpha_{08})\big)\,\,\,} \alpha_{08}z^5 + \alpha_{00}z^4 + \alpha_{14}z^3 + \alpha_{14}z^2 + \alpha_{06}z \text{ -------------} \rightarrow Temp\_R_5(z)$

SECOND STEP $R_6(z) \div_g R_5(z) = Q_0(z)$ WITH REMAINDER $R_4(z)$ LATTER HALF $R_5(z) = S(z)$ $\alpha_{08}$ $(\alpha_{02}z^5 + \alpha_{10}z^4 + \alpha_{02}z^3 + \alpha_{01}z^2 + \alpha_{01}z + \alpha_{08})\overline{\big)\, \alpha_{08}z^5 + \alpha_{00}z^4 + \alpha_{14}z^3 + \alpha_{14}z^2 + \alpha_{06}z \text{ -------------} \rightarrow Temp\_R_5(z)}$ $\phantom{xxxxxxxxxxxxxxxxxxxxxxxxxxxxxx} \alpha_{08}z^5 + \alpha_{01}z^4 + \alpha_{08}z^3 + \alpha_{07}z^2 + \alpha_{07}z + \alpha_{14}$ $\phantom{xxxxxxxxxxxxxxxxxxxxxxxxxxxxxxxxxxx} \alpha_{04}z^4 + \alpha_{06}z^3 + \alpha_{01}z^2 + \alpha_{10}z + \alpha_{14} \text{ ----} \rightarrow R_4(z)$

THIRD STEP $R_5(z) \div_g R_4(z) = Q_1(z)$ WITH REMAINDER $R_3(z)$ FIRST HALF $R_4(z)$ $\alpha_{13}z$ $(\alpha_{04}z^4 + \alpha_{06}z^3 + \alpha_{01}z^2 + \alpha_{10}z + \alpha_{14})\overline{\big)\, \alpha_{02}z^5 + \alpha_{10}z^4 + \alpha_{02}z^3 + \alpha_{01}z^2 + \alpha_{01}z + \alpha_{08} \text{ ----} \rightarrow R_5(z)}$ $\phantom{xxxxxxxxxxxxxxxxxxxxxxxxxxxxxx} \alpha_{02}z^5 + \alpha_{04}z^4 + \alpha_{14}z^3 + \alpha_{08}z^2 + \alpha_{12}z$ $\phantom{xxxxxxxxxxxxxxxxxxxxxxxxxxxxxxxxxx} \alpha_{02}z^4 + \alpha_{13}z^3 + \alpha_{10}z^2 + \alpha_{13}z + \alpha_{08} \text{ ----} \rightarrow Temp\_R_4(z)$

FOURTH STEP $R_5(z) \div_g R_4(z) = Q_1(z)$ WITH REMAINDER $R_3(z)$ LATTER HALF $R_4(z)$ $\alpha_{13}$ $(\alpha_{04}z^4 + \alpha_{06}z^3 + \alpha_{01}z^2 + \alpha_{10}z + \alpha_{14})\overline{\big)\, \alpha_{02}z^4 + \alpha_{13}z^3 + \alpha_{10}z^2 + \alpha_{13}z + \alpha_{08} \text{ ----} \rightarrow Temp\_R_4(z)}$ $\phantom{xxxxxxxxxxxxxxxxxxxxxxxxxxxxxx} \alpha_{02}z^4 + \alpha_{04}z^3 + \alpha_{14}z^2 + \alpha_{08}z + \alpha_{12}$ $\phantom{xxxxxxxxxxxxxxxxxxxxxxxxxxxxxxxxxxxx} \alpha_{11}z^3 + \alpha_{11}z^2 + \alpha_{03}z + \alpha_{09} \text{ ----} \rightarrow R_3(z)$

FIFTH STEP $R_4(z) \div_g R_3(z) = Q_2(z)$ WITH REMAINDER $R_2(z)$ FIRST HALF $R_3(z)$ $\alpha_{08}z$ $(\alpha_{11}z^3 + \alpha_{11}z^2 + \alpha_{03}z + \alpha_{09})\overline{\big)\, \alpha_{04}z^4 + \alpha_{06}z^3 + \alpha_{01}z^2 + \alpha_{10}z + \alpha_{14} \text{ ----} \rightarrow R_4(z)}$ $\phantom{xxxxxxxxxxxxxxxxxxxxxxxxxx} \alpha_{04}z^4 + \alpha_{04}z^3 + \alpha_{11}z^2 + \alpha_{02}z$ $\phantom{xxxxxxxxxxxxxxxxxxxxxxxxxxxxxxx} \alpha_{12}z^3 + \alpha_{05}z^2 + \alpha_{04}z + \alpha_{14} \text{ ----} \rightarrow Temp\_R_3(z)$

SIXTH STEP $R_4(z) \div_g R_3(z) = Q_2(z)$ WITH REMAINDER $R_2(z)$ LATTER HALF $R_3(z)$ $\alpha_{01}$ $(\alpha_{11}z^3 + \alpha_{11}z^2 + \alpha_{03}z + \alpha_{09})\overline{\big)\, \alpha_{12}z^3 + \alpha_{06}z^2 + \alpha_{04}z + \alpha_{14} \text{ ----} \rightarrow Temp\_R_3(z)}$ $\phantom{xxxxxxxxxxxxxxxxxxxxxxxxxx} \alpha_{12}z^3 + \alpha_{12}z^2 + \alpha_{04}z + \alpha_{14}$ $\phantom{xxxxxxxxxxxxxxxxxxxxxxxxxxxxxxxxxxxx} \alpha_{04}z^2 + 0\,z + \alpha_{11} \text{ ----} \rightarrow R_2(z)$

FIG. 20

| | |
|---|---|
| FIRST STEP $B_{-1}(z)$ | FIRST HALF OF $B_{-1}(z) + Q_0(z)B_0(z) = B_1(z)$ $B_0(z)$ $\text{Temp\_B}_1(z)$ |
| $0 + \alpha_{13}z^1$ | $1 = \alpha_{13}z^1$ |
| SECOND STEP $\text{Temp\_B}_1(z)$ | LATTER HALF OF $B_{-1}(z) + Q_0(z)B_0(z) = B_1(z)$ $B_0(z)$ $B_1(z)$ |
| $\alpha_{13}z^1 + \alpha_{06}$ | $1 = \alpha_{13}z^1 + \alpha_{06}$ |
| THIRD STEP $B_0(z)$ | FIRST HALF OF $B_0(z) + Q_1(z)B_1(z) = B_2(z)$ $B_1(z)$ $\text{Temp\_B}_2(z)$ |
| $0 + \alpha_{13}z^1 (\alpha_{13}z^1 + \alpha_{06}) = \alpha_{11}z^2 + \alpha_{04}z^1 + 1$ | |
| FOURTH STEP $\text{Temp\_B}_2(z)$ | LATTER HALF OF $B_0(z) + Q_1(z)B_1(z) = B_2(z)$ $B_1(z)$ $B_2(z)$ |
| $\alpha_{11}z^2 + \alpha_{04}z^1 + 1 + \alpha_{13} (\alpha_{13}z^1 + \alpha_{06}) = \alpha_{11}z^2 + \alpha_{13}z^1 + \alpha_{01}$ | |
| FIFTH STEP $B_1(z)$ | FIRST HALF OF $B_1(z) + Q_2(z)B_2(z) = B_3(z)$ $B_2(z)$ $\text{Temp\_B}_3(z)$ |
| $\alpha_{13}z^1 + \alpha_{06} + \alpha_{03}z^1 (\alpha_{11}z^2 + \alpha_{13}z^1 + \alpha_{01}) = \alpha_{04}z^3 + \alpha_{06}z^2 + \alpha_{10}z^1 + \alpha_{06}$ | |
| SIXTH STEP $\text{Temp\_B}_3(z)$ | LATTER HALF OF $B_1(z) + Q_2(z)B_2(z) = B_3(z)$ $B_2(z)$ $B_3(z)$ |
| $\alpha_{04}z^3 + \alpha_{06}z^2 + \alpha_{10}z^1 + \alpha_{06} + \alpha_{01} (\alpha_{11}z^2 + \alpha_{13}z^1 + \alpha_{01}) = \alpha_{04}z^3 + \alpha_{04}z^2 + \alpha_{11}z^1 + \alpha_{03}$ | |

FIG.21

$$\begin{array}{r} \alpha_{01}z^1 \phantom{+\alpha_{06}z^5 + \alpha_{07}z^4 + \alpha_{08}z^3 + \alpha_{09}z^2 + \alpha_{10}z^1 + \alpha_{11}} \\ \hline \alpha_{05}z^4 + \alpha_{06}z^3 + \alpha_{07}z^2 + \alpha_{08}z^1 + \alpha_{09} \overline{\smash{\big)}\ \alpha_{06}z^5 + \alpha_{07}z^4 + \alpha_{08}z^3 + \alpha_{09}z^2 + \alpha_{10}z^1 + \alpha_{11}} \\ \underline{\alpha_{06}z^5 + \alpha_{07}z^4 + \alpha_{08}z^3 + \alpha_{09}z^2 + \alpha_{10}z^1 \phantom{+ \alpha_{11}}} \\ 0 \quad\ \ 0 \quad\ \ 0 \quad\ \ 0 \quad\ \ 0 \quad\ \ \alpha_{11} \end{array}$$

THE NUMBER OF DEGREES FALLS AT LEAST TWO.

FIG.22

| INITIAL VALUES | COMPUTATIONS OF Ri(z) | | | | | | COMPUTATIONS OF Bi(z) |
|---|---|---|---|---|---|---|---|
| | #6 | #5 | #4 | #3 | #2 | #1 | |
| REGISTER 10 | $\alpha_{02}$ | $\alpha_{10}$ | $\alpha_{02}$ | $\alpha_{01}$ | $\alpha_{01}$ | $\alpha_{08}$ | |
| REGISTER 20 | $\alpha_{00}$ | 0 | 0 | 0 | 0 | 0 | |

AFTER 1 STEP

| | #6 | #5 | #4 | #3 | #2 | | |
|---|---|---|---|---|---|---|---|
| REGISTER 10 | $\alpha_{02}$ | $\alpha_{10}$ | $\alpha_{02}$ | $\alpha_{01}$ | $\alpha_{01}$ | | |
| REGISTER 20 | $\alpha_{08}$ | $\alpha_{00}$ | $\alpha_{14}$ | $\alpha_{14}$ | $\alpha_{06}$ | | |

AFTER 2 STEP

| | #6 | #5 | #4 | #3 | | | |
|---|---|---|---|---|---|---|---|
| REGISTER 10 | $\alpha_{04}$ | $\alpha_{06}$ | $\alpha_{01}$ | $\alpha_{10}$ | | | |
| REGISTER 20 | $\alpha_{02}$ | $\alpha_{10}$ | $\alpha_{02}$ | $\alpha_{01}$ | | | |

AFTER 3 STEP

| | #6 | #5 | #4 | | | | |
|---|---|---|---|---|---|---|---|
| REGISTER 10 | $\alpha_{04}$ | $\alpha_{06}$ | $\alpha_{01}$ | | | | |
| REGISTER 20 | $\alpha_{02}$ | $\alpha_{13}$ | $\alpha_{10}$ | | | | |

AFTER 4 STEP

| | #6 | #5 | | | | | |
|---|---|---|---|---|---|---|---|
| REGISTER 10 | $\alpha_{11}$ | $\alpha_{11}$ | | | | | |
| REGISTER 20 | $\alpha_{04}$ | $\alpha_{06}$ | | | | | |

AFTER 5 STEP

| | #6 | | | | | | |
|---|---|---|---|---|---|---|---|
| REGISTER 10 | $\alpha_{11}$ | | | | | | |
| REGISTER 20 | $\alpha_{12}$ | | | | | | |

AFTER 6 STEP
(IN ACTUALITY, COEFFICIENTS AFTER 6 STEPS NEED NOT BE STORED IN REGISTERS)

| REGISTER 10 | | | | | | | |
|---|---|---|---|---|---|---|---|
| REGISTER 20 | | | | | | | |

FIG. 25

WHEN σ(z) IS OF tTH DEGREE

| REGISTER 10 | #2t | #2t-1 | #2t-2 | .. | #t+1 | #t | #t-1 | .. | #0 |
|---|---|---|---|---|---|---|---|---|---|
| σ(z) | tTH DEGREE | (t−1)TH DEGREE | (t−2)TH DEGREE | .. | FIRST DEGREE | 0TH DEGREE | | | |

WHEN σ(z) IS OF (t-1)TH DEGREE

| REGISTER 10 | #2t | #2t-1 | #2t-2 | .. | #t+1 | #t | #t-1 | .. | #0 |
|---|---|---|---|---|---|---|---|---|---|
| σ(z) | (t−1)TH DEGREE | (t−2)TH DEGREE | (t−3)TH DEGREE | .. | 0TH DEGREE | | | | |

:

WHEN σ(z) IS OF SECOND DEGREE

| REGISTER 10 | #2t | #2t-1 | #2t-2 | .. | #t+1 | #t | #t-1 | .. | #0 |
|---|---|---|---|---|---|---|---|---|---|
| σ(z) | SECOND DEGREE | FIRST DEGREE | 0TH DEGREE | | | | | | |

WHEN σ(z) IS OF FIRST DEGREE

| REGISTER 10 | #2t | #2t-1 | #2t-2 | .. | #t+1 | #t | #t-1 | .. | #0 |
|---|---|---|---|---|---|---|---|---|---|
| σ(z) | FIRST DEGREE | 0TH DEGREE | | | | | | | |

FIG. 26

PROCESSING MODULE, ERROR CORRECTION DECODING CIRCUIT, AND PROCESSING METHOD FOR ERROR LOCATOR POLYNOMIAL

BACKGROUND OF THE INVENTION

1. Field of the Invention

The present invention relates to a processing module, an error correction decoding circuit, and a processing method for an error locator polynomial. More particularly, it relates to a processing module in which Euclid's algorithm specialized to binary BCH code is improved and which implements Euclid's algorithm processing within an error correction decoding circuit (decoder), the error correction decoding circuit, and a processing method for an error locator polynomial.

2. Description of the Related Art

An error correction decoding circuit in optical communications is used in order that original data may be restored by correcting errors mixed with transmission degradation on an optical fiber as shown in FIG. 5 by way of example.

Error correction circuits are generally employed in the fields of communications, computers, audios/videos, etc. For the purpose of making error corrections, data need to be turned into codes, the representative ones of which are Bose-Chaudhuri-Hocquenghem (BCH) code. With the BCH code, as shown in FIG. 6 by way of example, data are inputted to a decoding circuit in the unit of one code length so as to execute a correction process.

One code length is constituted by several words, and the BCH code in which one word is of one bit as shown in FIG. 7 by way of example are called "binary BCH code" or simply the "BCH code". Besides, the BCH code in which one word is not of one bit (one word is formed of a plurality of bits) as shown in FIG. 8 by way of example are called "non-binary BCH code" or "Reed-Solomon (RS) code".

Both the BCH code and the RS code conform to processing rules on Galois fields. A Galois field GF (16), for example, has elements of 0, 1, $\alpha_1$, ... and $\alpha_{14}$, totaling sixteen. Also the results of the additions and multiplications of these elements become any of the sixteen elements 0, 1, $\alpha_1$, ... and $\alpha_{14}$, as in the addition (or subtraction) table of the Galois field GF (16) exemplified in FIG. 9 and the multiplication table thereof exemplified in FIG. 10, respectively. By way of examples, the following holds:

$$\alpha_{14} + \alpha_8 = \alpha_6 \in GF(16) \quad (1)$$

$$\alpha_{14} \times \alpha_8 = \alpha_7 \in GF(16) \quad (2)$$

In the case of the Galois field GF (16), the tables of the additions and multiplications become ones of 16 rows×16 columns=256 elements. By the way, in some cases, the element "0" of the Galois field is expressed as "$\alpha_\infty$", and the element "1" as "$\alpha_0$". Besides, the subtraction of the Galois field becomes the same processing as the addition as follows:

$$\alpha_{14} - \alpha_8 = \alpha_{14} + \alpha_8 \in GF(16) \quad (3)$$

In the field of optical networks, the International Telecommunication Union (hereinbelow, termed "ITU-T") formally stipulated the addition of an error correction function to an information transmission frame, in Recommendation G. 709 (Non-patent Document 1) in 2003. In Recommendation G. 709, RS code as indicated in Table 1 were first employed. The RS code conform to processing rules on a Galois field GF (256). More specifically, the Galois field GF (256) has 256 elements, and the tables of the additions and multiplications of the elements become ones of 256 rows×256 columns=65536 elements.

TABLE 1

| ITEM | CONTENTS |
| --- | --- |
| Code format | RS code (one word = 8 bits) |
| One code length | 255 words |
| Processing rules | Conforming to GF (256) |
| Correction function | Correctable up to 8 words |

In recent years, however, transmission capacities have rapidly increased with the spread of Internet communications and the enhancements of optical fiber communication technology, and the attendant degradations of signal qualities have become serious, so that error correction codes the correction rate of which is higher than that of the RS code have been required.

Description on concatenated codes formed of two different BCH code is contained in Recommendation G. 975. 1 (Non-patent Document 2) of the ITU-T, and the concatenated codes have a correction capability higher than that of the RS code of the Galois field GF (256) indicated before. Here, the two BCH code shall be respectively written as "BCH_1" and "BCH_2" for the sake of convenience. The BCH code BCH_1 are encoded as indicated in Table 2 by way of example.

TABLE 2

| ITEM | CONTENTS |
| --- | --- |
| Code format | BCH code (one word = one bit) |
| One code length | 3860 words |
| Processing rules | Conforming to GF (4096) |
| Correction function | Correctable up to 3 words |

Besides, the BCH code BCH_2 are encoded as indicated in Table 3.

TABLE 3

| ITEM | CONTENTS |
| --- | --- |
| Code format | BCH code (one word = one bit) |
| One code length | 2040 words |
| Processing rules | Conforming to GF (2048) |
| Correction function | Correctable up to 10 words |

For the purpose of making efficient corrections with the concatenated codes, pluralities of identical decoding circuits need to be used in view of the characteristics of algorithms and transmission data. In the example of Recommendation G. 975. 1, as the decoding circuit of the concatenated codes, the decoding circuits of the codes BCH_1 are introduced to be in the number of 8×3=24, and those of the codes BCH_2 are introduced to be 16×3=48. A configurational example of the decoding circuit of the concatenated codes is shown in FIG. 12. The logic scale of this circuit becomes a scale of, for example, several megagates, and the capacity of memories to be mounted becomes several megabits. Considering that the logic scale of the decoding circuit of the RS code indicated in Table 1 is several tens kilogates, and that the memory capacity thereof is several tens kilobits, the logic scale of the decoding circuit of the concatenated codes in Tables 2 and 3 is very gigantic.

Further, in packaging the decoding circuit of the concatenated codes into an LSI, also the parameter of an operating frequency needs to be considered in addition to the logic scale and the memory capacity. The reason therefor is that, when the value of the operating frequency is low, a wiring delay is incurred at the high-speed operation of the LSI, so the circuit fails to operate normally.

In order to design the decoding circuit of the concatenated codes up to an actual level in view of these facts, the optimization of the decoding circuit of the BCH code becomes a very important problem. However, most of the BCH code heretofore proposed have been encoded with a small number of elements in such a Galois field as GF (16) or GF (32), and also the number of correction words of the decoding circuit has been 1 to 3 words or so. In contrast, in the above case of Table 2 or Table 3, the number of elements is large as in the Galois field GF (2048) or GF (4096), and further, as many words as 10 are corrected. In general, as the number of the elements of a Galois field becomes larger, and as the number of correctable words increases more, a decoding circuit becomes more complicated, and the logic scale of the decoding circuit enlarges more. It is the actual situation that the optimization of such a decoding circuit of the BCH code has hardly progressed as compared with that of the decoding circuit of RS code.

In this specification, JP-A-5-165662 is mentioned as Patent Document 1, and JP-A-7-240692 is mentioned as Patent Document 2.

SUMMARY OF THE INVENTION

In view of the above point, the present invention has for its object to simplify a controlling circuit configuration for the purpose of raising an operating frequency with the minimum latency or a small latency, and to decrease a resource quantity for the purpose of reducing a logic scale. Besides, another object of the invention is to execute the substitution control of a polynomial and a protection control in the case where the difference of degrees is larger than one.

The invention has for its object to provide a processing module for obtaining an error locator polynomial, an error correction decoding circuit and a processing method in which the candidate $B_i(z)$ of the necessary error locator polynomial can be calculated without executing part of the processing of the candidate $R_i(z)$ of an error evaluator polynomial. Besides, another object of the invention is to provide a processing module, etc. in which the processing of the unnecessary candidate $R_i(z)$ is stopped in accordance with the number of steps, and the multiplication and addition of a Galois field at this part are transferred to the processing of the candidate $B_i(z)$. In a memory having a predetermined storage area, the invention has for its object to decrease an area where the coefficients of the candidate $R_i(z)$ are stored, in accordance with the number of steps, and to assign the decrement to an area where the coefficients of the candidate $B_i(z)$ are stored. Besides, in Euclid's algorithm processing, the invention has for its object to derive the candidate $B_i(z)$ without computing the low-dimensional terms of the candidate $R_i(z)$.

According to the first solving means of this invention, there is provided a processing module for obtaining an error locator polynomial of BCH code in an error correction decoding circuit in which error corrections of t words (where t denotes a predetermined integer) are performed using the error locator polynomial, comprising:

a first register which includes 0th to 2tth storage areas, and in which coefficients of a syndrome polynomial are stored in the first to 2tth storage areas beforehand;

a second register which includes 0th to 2tth storage areas;

a Galois field division unit which subjects the coefficient stored in the 2tth storage area of said second register, to a Galois field division by the coefficient stored in the 2tth storage area of said first register;

a group of Galois field multiplication units which subject a result of the division of said Galois field division unit and the 0th to (2t−1)th coefficients of said first register to Galois field multiplications, respectively;

a group of Galois field addition units which subject the coefficients obtained by said group of Galois field multiplication units and the 0th to (2t−1)th coefficients of said second register to Galois field additions, respectively;

a first selector which selects either outputs from said group of Galois field addition units or the coefficients stored in said first register, thereby to select the coefficients stored in either said first or second register;

a shifter is for storing outputs from said first selector, in the predetermined storage areas of said first or second register;

an insertion unit which substitutes into zero or deletes one of the coefficients outputted from said first selector; and a second selector which is for storing outputs from said shifter into one of said first register and said second register, and storing outputs from said insertion unit into the other of said first register and said second register;

wherein coefficients of the error locator polynomial are obtained by repeating steps which include the calculations by said Galois field division unit, said group of Galois field multiplication units and said group of Galois field addition units.

According to the second solving means of this invention, there is provided an error correction decoding circuit wherein error corrections of t words (where t denotes a predetermined integer) are performed using an error locator polynomial of BCH code, comprising:

a syndrome calculation unit which obtains a syndrome polynomial from an input signal;

a processing module which obtains an error locator polynomial; and an error correction unit which corrects an error of the input signal on the basis of a coefficient of the error locator polynomial outputted from said processing module;

wherein said processing module includes:

a first register which includes 0th to 2tth storage areas, and in which coefficients of the syndrome polynomial obtained by said syndrome calculation unit are stored in the first to 2tth storage areas;

a second register which includes 0th to 2tth storage areas;

a Galois field division unit which subjects the coefficient stored in the 2tth storage area of said second register, to a Galois field division by the coefficient stored in the 2tth storage area of said first register;

a group of Galois field multiplication units which subject a result of the division of said Galois field division unit and the 0th to (2t−1)th coefficients of said first register to Galois field multiplications, respectively;

a group of Galois field addition units which subject the coefficients obtained by said group of Galois field multiplication units and the 0th to (2t−1)th coefficients of said second register to Galois field additions, respectively;

a first selector which selects either outputs from said group of Galois field addition units or the coefficients stored in said first register, thereby to select the coefficients stored in either said first or second register;

a shifter which is for storing outputs from said first selector, in the predetermined storage areas of said first or second register;

an insertion unit which substitutes into zero or deletes one of the coefficients outputted from said first selector; and a second selector which is for storing outputs from said shifter into one of said first register and said second register, and storing outputs from said insertion unit into the other of said first register and said second register;

wherein coefficients of the error locator polynomial are obtained by repeating steps which include the calculations by said Galois field division unit, said group of Galois field multiplication units and said group of Galois field addition units, and are outputted to said error correction unit.

According to the third solving means of this invention, there is provided a processing method for an error locator polynomial of BCH code for performing error corrections of t words (where t denotes a predetermined integer) with the error locator polynomial, including:

a Galois field division step of inputting from a second register which includes 0th to 2tth storage areas, a first coefficient stored in the 2tth storage area of the second register, inputting from a first register which includes 0th to 2tth storage areas and in which coefficients of a syndrome polynomial are stored in the first to 2tth storage areas beforehand, a second coefficient stored in the 2tth storage area of the first register, and subjecting the first coefficient to a Galois field division by the second coefficient;

a Galois field multiplication step of subjecting a result of the division of said Galois field division step and 0th to (2t−1)th coefficients of the first register to Galois field multiplications, respectively;

a Galois field addition step of subjecting the coefficients obtained at said Galois field multiplication step and 0th to (2t−1)th coefficients of the second register to Galois field additions, respectively;

a shift step of shifting processed results of said Galois field addition step or the 0th to (2t−1)th coefficients of the first register so as to be stored in the predetermined storage areas of the first or second register;

an insertion step of substituting into zero or deleting one of the coefficients stored in the first or second register; and a storage step of storing a processed result of said shift step into one of the first register and the second register, and storing a processed result of said insertion step into the other of the first register and the second register;

wherein coefficients of the error locator polynomial are obtained by repeating steps which include said Galois field division step, said Galois field multiplication step and said Galois field addition step.

According to the present invention, it can simplify a controlling circuit configuration for the purpose of raising an operating frequency with the minimum latency or a small latency, and decrease a resource quantity for the purpose of reducing a logic scale. Besides, according to the present invention, it can execute the substitution control of a polynomial and a protection control in the case where the difference of degrees is larger than one.

According to the present invention, it can provide a processing module for obtaining an error locator polynomial, an error correction decoding circuit and a processing method in which the candidate $B_i(z)$ of the necessary error locator polynomial can be calculated without executing part of the processing of the candidate $R_i(z)$ of an error evaluator polynomial. Besides, according to the present invention, it can provide a processing module, etc. in which the processing of the unnecessary candidate $R_i(z)$ is stopped in accordance with the number of steps, and the multiplication and addition of a Galois field at this part are transferred to the processing of the candidate $B_i(z)$. According to the present invention in a memory having a predetermined storage area, it can decrease an area where the coefficients of the candidate $R_i(z)$ are stored, in accordance with the number of steps, and assign the decrement to an area where the coefficients of the candidate $B_i(z)$ are stored. Besides, according to the present invention in Euclid's algorithm processing, it can derive the candidate $B_i(z)$ without computing the low-dimensional terms of the candidate $R_i(z)$.

Besides, in accordance with the invention, a configuration is simplified in spite of the fact that three controls (1)-(3) to be stated later are performed. Therefore, an operating frequency is higher than in the prior art, and a resource quantity becomes as follows by way of example: The resource quantity is smaller even when compared with any of a basic resource quantity to be detailed later, a resource quantity in JP-A-5-165662, and a resource quantity in JP-A-7-240692.

Capacity of Registers . . . corresponding to 4t+2 coefficients
Galois field division unit . . . one
Galois field multiplication units . . . 2t
Galois field multiplication (exclusive "or") units . . . 2t

BRIEF DESCRIPTION OF THE DRAWINGS

FIG. 9 is a diagram showing the addition (subtraction) table of a Galois field GF (16);

FIG. 10 is a diagram showing the multiplication table of the Galois field GF (16);

FIG. 11 is a diagram showing the inverse element table of the Galois field GF (16);

FIG. 18 shows a computational example of a polynomial $R_i(z)$;

FIG. 19 shows a computational example of a polynomial $B_i(z)$;

FIG. 20 shows that computational example of the polynomial $R_i(z)$ which is divided into two steps;

FIG. 21 shows that computational example of the polynomial $B_i(z)$ which is divided into two steps;

FIG. 22 shows an example in which the difference of the degrees of a remainder polynomial and a dividend polynomial becomes, at least, two;

FIG. 25 shows concrete examples of the values of a register 10 and a register 20; and FIG. 26 is a diagram showing the relations between the register 10 and the coefficients of an error locator polynomial $\sigma(z)$.

DESCRIPTION OF THE PREFERRED EMBODIMENTS

1. Error Corrections and Concrete Examples of Problems

Figure 13:
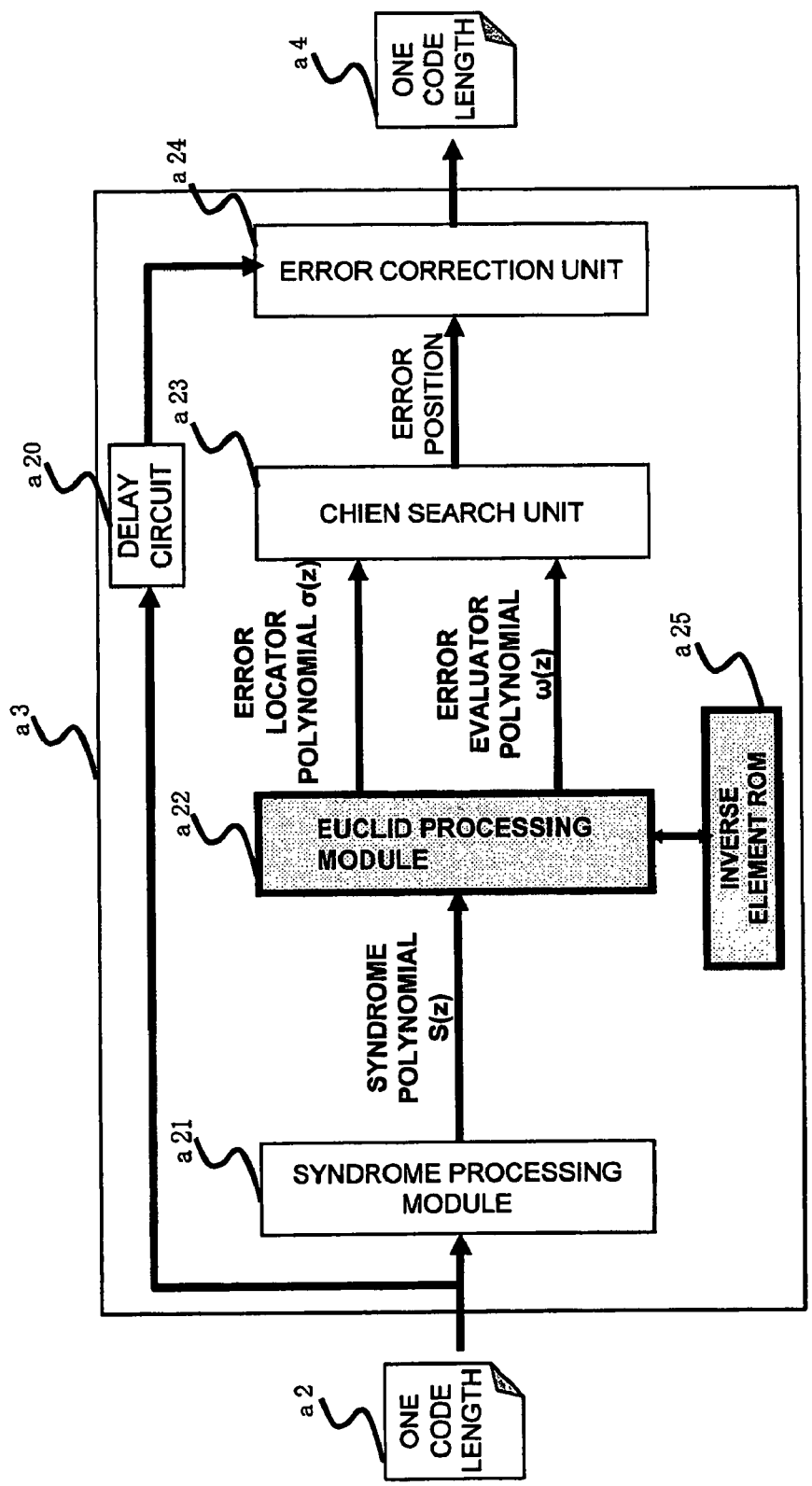
FIG. 13 is a configurational diagram of the decoding circuit of BCH code.

FIG. 13 shows a configurational example of an error correction decoding circuit.

Improvements have been made with notice taken of Euclid's processing module a22 (refer to FIG. 13) within the decoding circuit of BCH code. The Euclid processing module is a unit which calculates an error locator polynomial and an error evaluator polynomial from a syndrome polynomial, and it has a circuit configuration which is much more complicated than any other unit. Therefore, the configuration of the Euclid processing module sometimes becomes so gigantic as assumes the majority of the decoding circuit, or an operating frequency lowers abruptly and is liable to form the causes of the degradation of the performance of the whole decoding circuit, etc.

Figure 14:
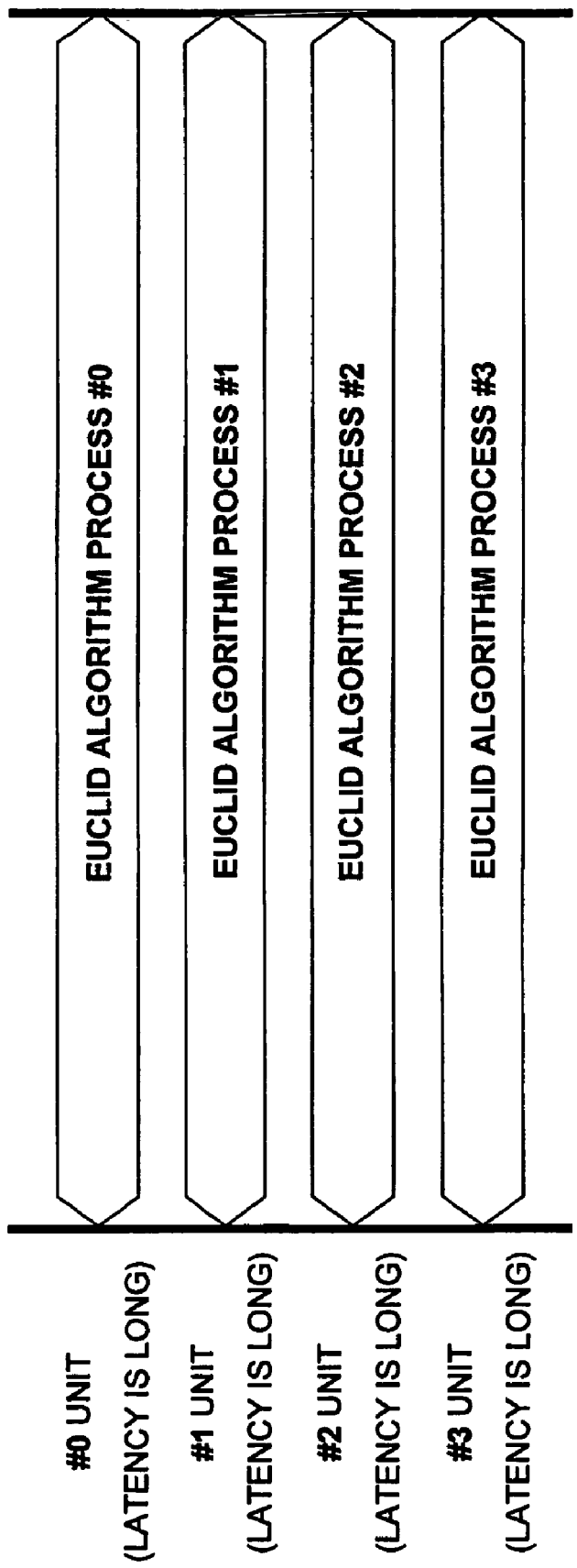
FIG. 14 is a time chart of Euclid processing modules of long latencies.
Figure 15:
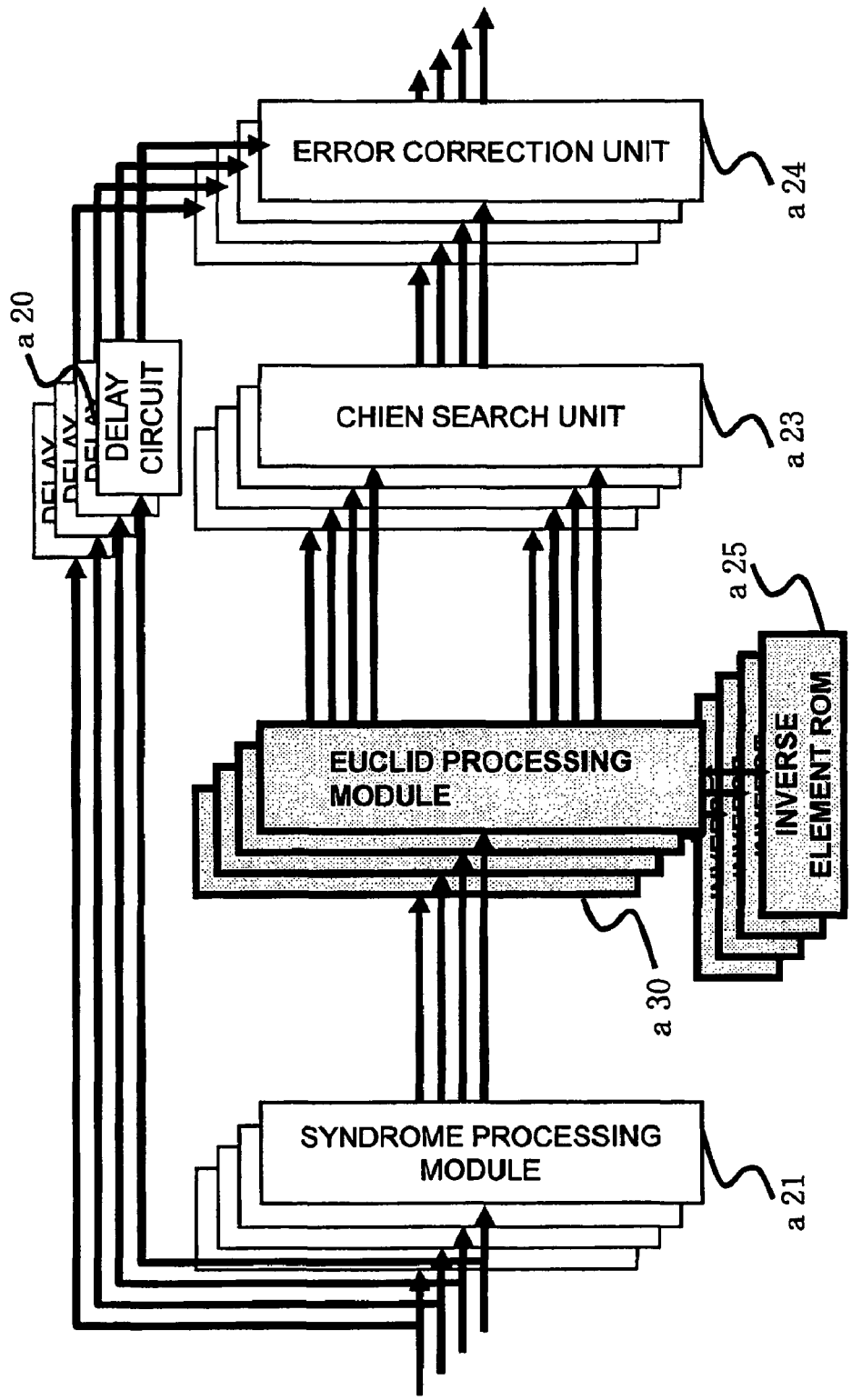
FIG. 15 is a diagram of a circuit configuration in which four processes are executed by four units.
Figure 16:
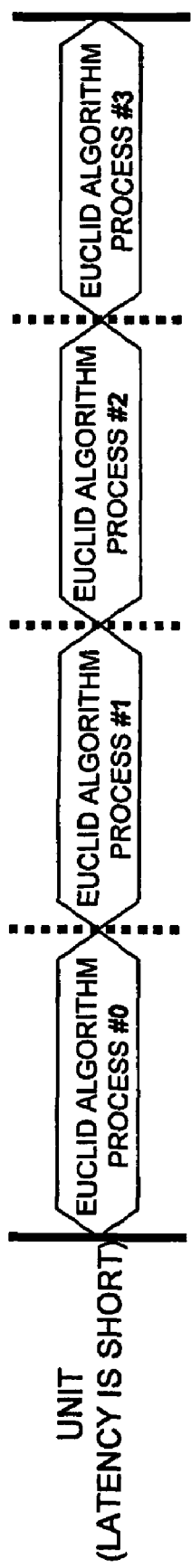
FIG. 16 is a time chart of a Euclid processing module of short latency.
Figure 17:
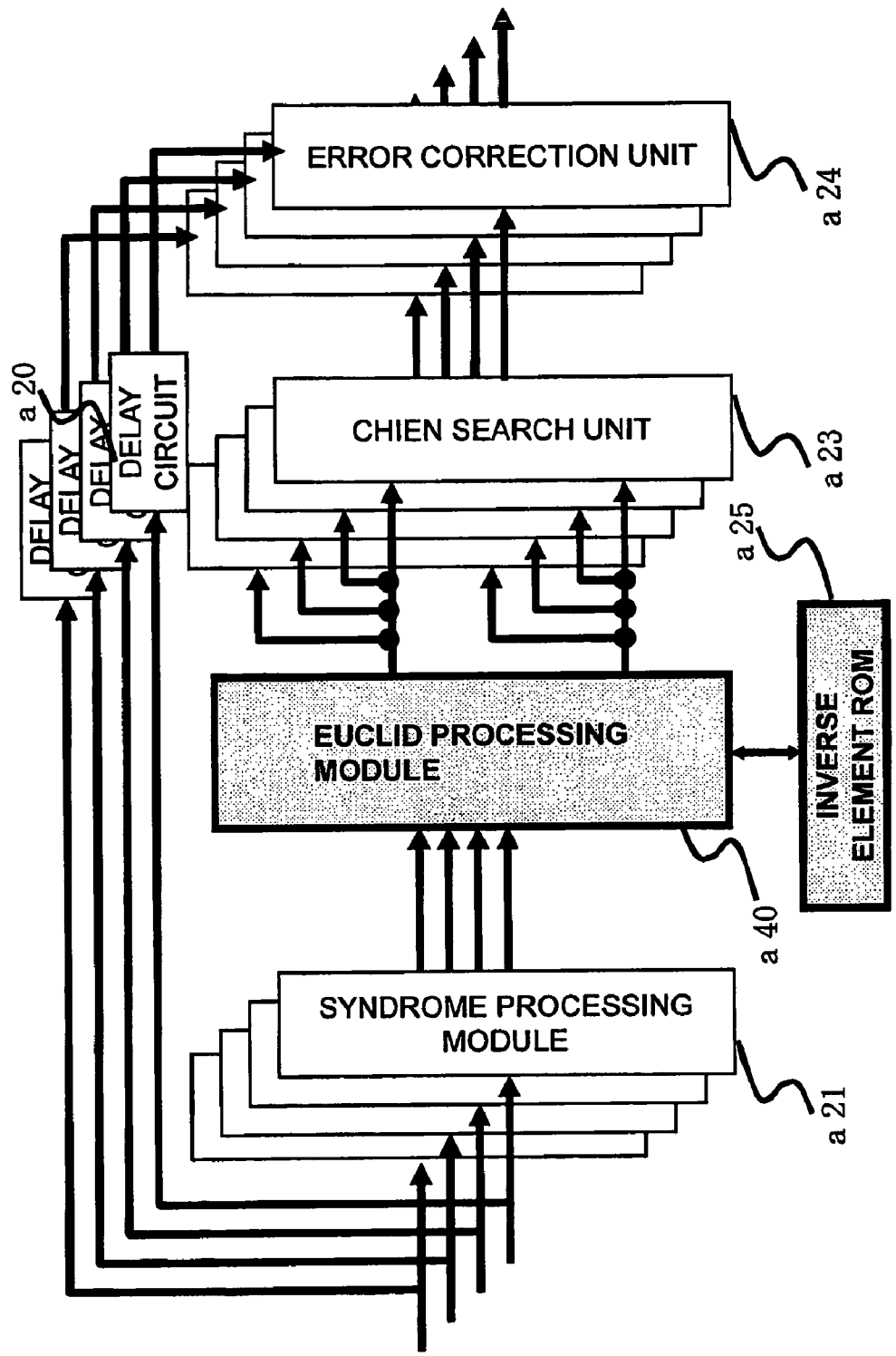
FIG. 17 is a diagram of a circuit configuration in which four processes are executed by one unit.

As the circuit configuration of the Euclid processing module, the optimum one can be selected in adaptation to a purpose. In a case, for example, where four decoding circuits are operating simultaneously, there is a method which directly uses four Euclid's processing modules as shown in FIG. 15 by way of example. Alternatively, as shown in FIG. 17 by way of another example, there is a method which uses a single Euclid's processing module and causes the single Euclid's processing module to execute a process four times within a one period, thereby quartering the length of a latency. With the configuration as shown in FIG. 15, a time chart becomes as shown in FIG. 14, and the latency of one Euclid processing module may well be longer than in the case of FIG. 17. On the other hand, with the configuration as shown in FIG. 17, a time chart becomes as shown in FIG. 16, and the latency of one Euclid processing module must be shorter than in the case of FIG. 16.

In general, a logic scale and a latency have the relation of trade-off, and when the logic scale is made small, the latency lengthens, whereas when the logic scale is enlarged, the latency shortens. Here in the current case, however, the latency may well be shortened even if the logic scale becomes somewhat large. The reason therefor is that, as shown in FIG. 13 by way of example, a memory for a Galois field division unit, called an "inverse element ROM", is mounted for the Euclid processing module.

In case of the Euclid processing module of codes BCH_2, the memory is of about 22.5 kilobits. In an example of concatenated codes, the decoding circuits of the codes BCH_2 as number 48 in all are mounted, and hence, memories which are as large as 22.5×48=1080.0 kilobits exist in all. From the viewpoint of the whole decoding circuit of the concatenated codes, therefore, it is more efficient to decrease the number of ROMs as shown in FIG. 17. For this purpose, the present invention has for its object to minimize the latency (or make the latency small).

The Euclid processing is a method for obtaining an error locator polynomial $\sigma(z)$ and an error evaluator polynomial $\omega(z)$ from a syndrome polynomial $S(z)$ as stated below. When a case of making the error corrections of t words is exemplified, the syndrome polynomial $S(z)$ is expressed by the following formula: Incidentally, the syndrome polynomial can be obtained by a syndrome processing module a21 on the basis of an input signal a1 of one code length.

$$S(z)=s_2 z^{2t-1}+s_{2t-1}z^{2t-2}+\ldots+s_2 z+s_1 \quad (4)$$

The error locator polynomial $\sigma(z)$ becomes:

$$\sigma(z)=(1-\alpha^{j1})(1-\alpha^{j2})\ldots(1-\alpha^{jL}) \quad (5)$$

where jL denotes an error position (L=1 to t).
The error evaluator polynomial $\omega(z)$ becomes:

$$\omega(z)=\Sigma_i^L=1 e_i \alpha^{j1} \pi k^L=1(1-\alpha^{jk}z) \quad (6)$$

The following limitations are imposed on the degrees of the respective polynomials:

$$\deg \sigma(z) \leq t \quad (7)$$

$$\deg \omega(z) \leq t-1 \quad (8)$$

The error locator polynomial $\sigma(z)$ and the error evaluator polynomial $\omega(z)$ can be obtained in the course of finding the greatest common measure of the known value $z^{2t}$ and the syndrome polynomial $S(z)$ as stated below. Here, $R_i(z)$ is defined to be the candidate polynomial of the error evaluator polynomial $\omega(z)$, while $B_i(z)$ is defined to be the candidate polynomial of the error locator polynomial $\sigma(z)$, and a suffix i is let denote the degree of each polynomial.

$R_i(z)$ has its initial values put as:

$$R_{2t}(z)=z^{2t}, R_{2t-1}(z)=S(z) \quad (9)$$

and the following computations are executed until (the degree of $R_i(z)$) $\leq$ (t−1) holds.

$$R_{2t}(z) \div_g R_{2t-1}(z) = Q_O(z) \text{ with remainder } R_{2t-2}(z) \quad (10)$$

$$R_{2t-1}(z) \div_g R_{2t-2}(z) = Q_1(z) \text{ with remainder } R_{2t-3}(z) \quad (11)$$

$$\vdots$$

$$R_{t+2}(z) \div_g R_{t+1}(z) = Q_{t-2}(z) \text{ with remainder } R_t(z) \quad (12)$$

$$R_{t+1}(z) \div_g R_t(z) = Q_{t-1}(z) \text{ with remainder } R_{t-1}(z) \quad (13)$$

Here, "$\div_g$" indicates the division of Gauss algorithm, and "$Q_i(z)$" indicates a polynomial which becomes a quotient. By the way, in case of the division of the Gauss algorithm, the degree of a remainder polynomial is lower than that of a dividend polynomial inevitably.

In the division of the above formula 13, $$\deg R_{t-1}(z) \leq t-1 \quad (14)$$

holds, and $R_{t-1}(z)$ becomes the error evaluator polynomial $\omega(z)$. Besides, the division $\div_g$ of the polynomial $R_i(z)$ is executed t times.

On the other hand, the polynomial $B_i(z)$ has its initial values put as:

$$B_{-1}(z)=0, B_o(z)=1 \quad (15)$$

The computations of the polynomial $B_i(z)$ are executed as stated below until (the degree of $R_i(z)$) $\leq$ (t−1) holds. That is, the number of times of the computations of the polynomial $B_i(z)$ depends upon the polynomial $R_i(z)$.

$$B_1(z) = B_{-1}(z) + Q_o(z)B_o(z) \quad (16)$$

$$B_2(z) = B_o(z) + Q_1(z)B_1(z) \quad (17)$$

$$\vdots$$

-continued $$B_{t-1}(z) = B_{t-3}(z) + Q_{t-2}(z)B_{t-2}(z) \quad (18)$$

$$B_t(z) = B_{t-2}(z) + Q_{t-1}(z)B_{t-1}(z) \quad (19)$$

"$Q_i(z)$" in the above formulas 16 to 19 indicates the polynomials derived in the formulas 10 to 13 of the polynomial $R_i(z)$. $B_t(z)$ obtained by the computation of the formula 19 becomes the error locator polynomial $\sigma(z)$, the degree on this occasion becomes:

$$\deg B_t(z) \leq t \quad (20)$$

and also the computations of $B_i(z)$ are executed t times.

Here, it is to be noted that $Q_i(z)$ needs to be computed for computing $B_i(z)$, and that $R_i(z)$ needs to be computed for computing $Q_i(z)$. That is, the computation of the error evaluator polynomial $\omega(z)$ is required for computing the error locator polynomial $\sigma(z)$.

Concrete examples will be explained under the conditions of the following Table 4:

TABLE 4

Figure 9:
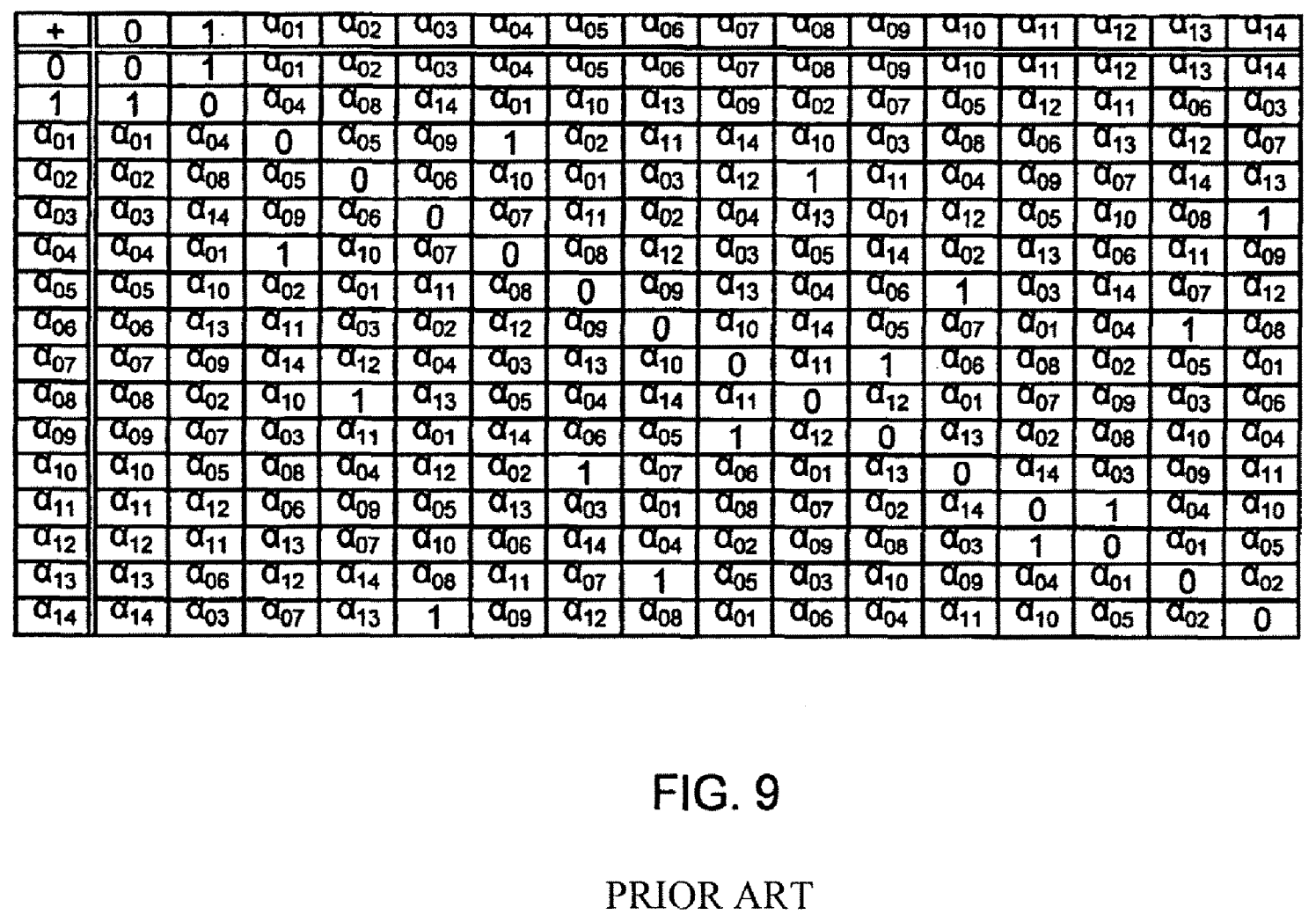
Figure 10:
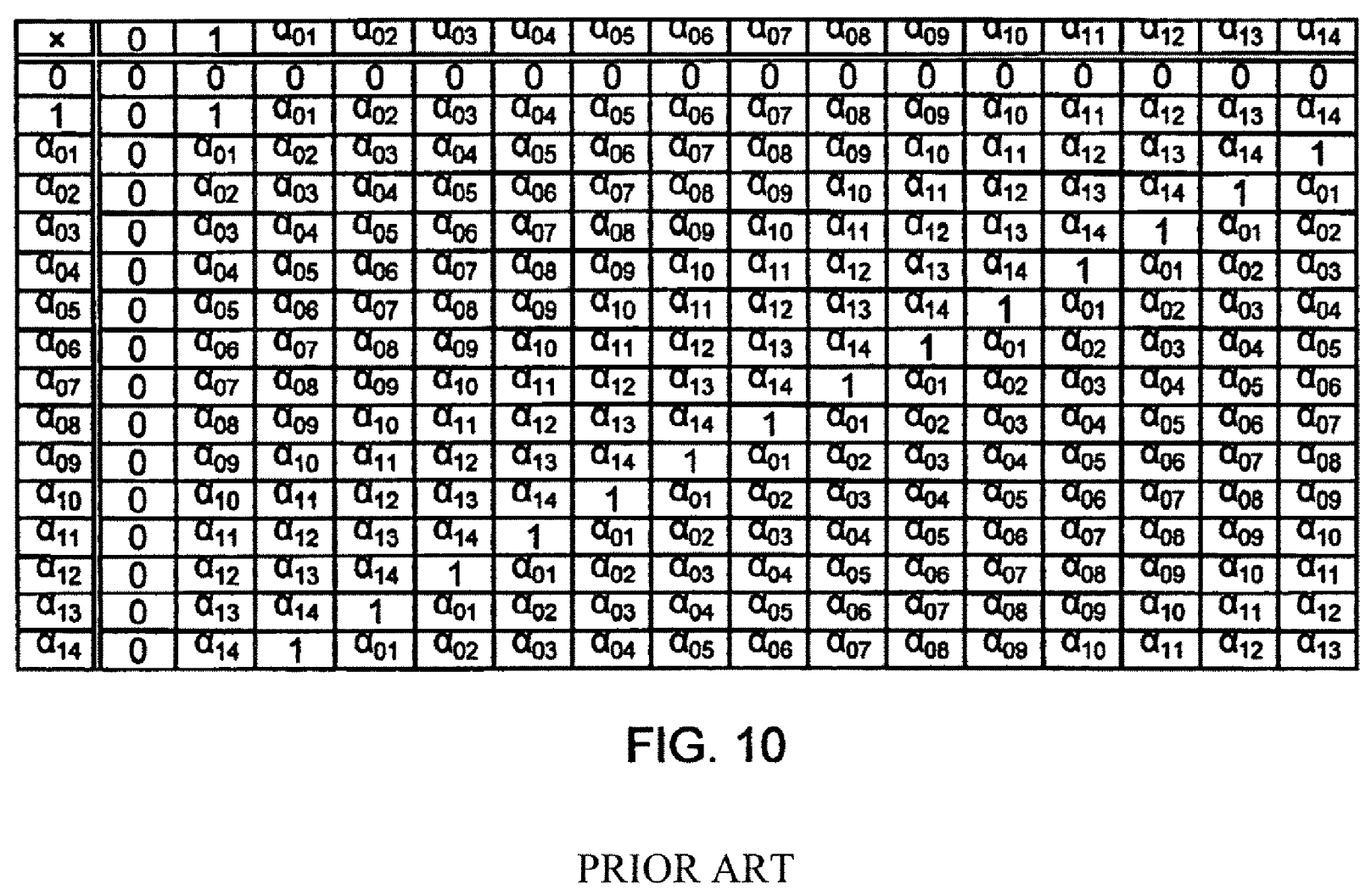

| ITEM | CONTENTS | REMARKS |
|---|---|---|
| Galois field | GF (16) | Conforming to processing rules of FIGS. 9 and 10 |
| Primitive polynomial | $x^4 = x + 1$ | |
| Correction function | Capable of error corrections up to 3 words | $t = 3$ |

As the syndrome polynomial, the following is used by way of example:

$$S(z) = \alpha_2 z^5 + \alpha_{10} z^4 + \alpha_2 z^3 + \alpha_1 z^2 + \alpha_1 z + \alpha_8 \quad (21)$$

The initial values of the syndrome polynomial are put as follows:

$$R_6(z) = z^6, R_5(z) = S(z), B_{-1}(z) = 0, \text{ and } B_0(z) = \alpha_0 = 1 \quad (22)$$

Then, as the computations of $R_i(z)$, as shown in FIG. 18, the divisions of the Gauss algorithm:

$$R_6(z) \div_g R_5(z) = Q_0(z) \text{ with remainder } R_4(z) \quad (23)$$

$$R_5(z) \div_g R_4(z) = Q_1(z) \text{ with remainder } R_3(z) \quad (24)$$

$$R_4(z) \div_g R_3(z) = Q_2(z) \text{ with remainder } R_2(z) \quad (25)$$

are executed three times in total, and $R_2(z)$ becomes the error evaluator polynomial $\omega(z)$.

On this occasion, as the computations of $B_i(z)$, as shown in FIG. 19, the computations:

$$B_1(z) = B_{-1}(z) + Q_0(z)B_0(z) \quad (26)$$

$$B_2(z) = B_0(z) + Q_1(z)B_1(z) \quad (27)$$

$$B_3(z) = B_1(z) + Q_2(z)B_2(z) \quad (28)$$

are executed three times in total, and $B_3(z)$ becomes the error locator polynomial $\sigma(z)$.

Mathematically, as indicated above, the computations of $B_i(z)$ and $R_i(z)$ are executed three times (in general, t times), whereby the error locator polynomial $\sigma(z)$ and error evaluator polynomial $\omega(z)$ to be found can be obtained. However, in a case where actual packaging into an LSI is intended, the above computations are simplified by, for example, a method as stated below.

First, the computations of $R_i(z)$ will be explained. Formula 23 can be divided into the following two formulas by defining "Temp_$R_5(z)$" anew:

$$R_6(z) \div R_5(z) = \alpha_{13} z \text{ with remainder Temp\_}R_5(z) \quad (29)$$

$$\text{Temp\_}R_5(z) + R_5(z) = \alpha_6 \text{ with remainder } R_4(z) \quad (30)$$

Here, $Q_0(z)$ can be obtained as follows from the quotients of Formulas 29 and 30:

$$Q_0(z) = \alpha_{13} z + \alpha_6 \quad (31)$$

By the way, in the division here, symbol $\div$ is used unlike the symbol $\div_g$ because the degree of the remainder polynomial is not always lower than that of the dividend polynomial.

In this manner, the division as indicated by Formula 23 is not executed at one time of step in the circuit, but it is calculated at the divided two times of steps of Formulas 29 and 30. In the case of t=3 on the current occasion, the computations of $R_i(z)$ are ended by 2×3=6 steps as shown in FIG. 20. Here, $R_2(z)$ at the sixth step in FIG. 20 becomes the error evaluator polynomial $\omega(z)$ which is to be found.

On this occasion, also in $B_i(z)$, "Temp_$B_0(z)$" is defined, whereby Formula 26 can be divided into two formulas as follows, and the computation of Formula 26 is executed at two times of steps:

$$\text{Temp\_}B_1(z) = B_{-1}(z) + \alpha_{13} z B_0(z) \quad (32)$$

$$B_1(z) = \text{Temp\_}B_1(z) + \alpha_6 B_0(z) \quad (33)$$

In the case of t=3 on the current occasion, the computations of $B_i(z)$ are ended after 6 steps as shown in FIG. 21. Here, $B_3(z)$ becomes the error locator polynomial $\sigma(z)$ which is to be found.

The present invention has for its object to minimize the latency, and the minimum latency becomes the 6 steps (in general, 2t steps) because the circuit is configured by the above method.

Next, the number of those calculations of each coefficient which are executed at the first time of step will be stated from $R_i(z)$. First, there will be explained the case of calculating without decreasing the coefficients. As shown in FIG. 20, first of all, a Galois field division for adapting the respective degrees of the dividend polynomial and divisor polynomial and the highest degree coefficient is executed one time. By way of example, at the first step in FIG. 20, the following is executed:

$$\alpha_{13} z = z^6 / \alpha_2 z^5 \quad (34)$$

Subsequently, six times of Galois field multiplications are executed every coefficient between the found coefficients (quotients) $\alpha_{13} z$ and $R_5(z)$. This is because the coefficients of $R_5(z)$ exists in the number of six. Subsequently, a Galois field addition (exclusive "or") is executed every coefficient (Temp_$R_5(z)$ is found). Although the coefficient of $R_6(z)$ seems to be one of only $z^6$, six times (in general, 2t times) of additions in total are actually executed by handling coefficients $z^5$ to $z^1$ as zero.

The processing number of times of the polynomial $B_i(z)$ needs to correspond to the number of the coefficients. In the case of t=3, the numbers of times of the additions and multiplications of the Galois fields are both four times (in general, (t+1) times). Originally, as shown in FIG. 21, the numbers of the coefficients of $B_i(z)$ differ at the respective steps. Therefore, the processing number of times is set in adaptation to the 2tth step at which the number of the coefficients is the largest.

The Euclid processing module requires circuit arrangements for the divisions, additions and multiplications of the Galois fields, and besides, circuit arrangements for controlling these calculations. The principal controls are, for example, the two of (1) the substitution control of the polynomial, and (2) the protection control of (the difference of degrees)>1.

First, (1) the substitution of the polynomial will be explained. At the second step in FIG. 20, $R_5(z)$ is a divisor polynomial. At the third step, however, $R_5(z)$ is substituted into a dividend polynomial. Besides, $R_4(z)$ is a remainder polynomial at the second step, but it is substituted into a divisor polynomial at the third step. In this manner, the divisor polynomial, the dividend polynomial and the remainder polynomial substitute their values at all times, and hence, circuit configurations for controlling these polynomials are required.

Next, (2) "the protection control of (the difference of degrees)>1" is a control for a situation where the difference of the degrees of the dividend polynomial and the divisor polynomial has become at least two. In the Euclid calculations, in most cases, the difference of the degrees of the dividend polynomial and the divisor polynomial is at most one at any of the first to sixth steps as shown in FIG. 20. As shown in FIG. 22, however, the difference of the degrees of the remainder polynomial and the dividend polynomial rarely becomes at least two. In this case, the difference of the degrees of the dividend polynomial and the divisor polynomial becomes at least two in the next computation. This state is a very specific state when viewed from a circuit, and the circuit cannot cope with the state without performing a special control. There occurs, for example, the case of a state where a division is made by a coefficient 0.

As a method for performing these two controls, it is also considered to perform the controls while the degrees of the dividend polynomial and the divisor polynomial are being counted on occasion. With this method, however, an operating frequency is drastically lowered in some cases. Therefore, it is one of problems in the Euclid processing module improvements in the invention that any contrivance is made to realize these controls with the simple circuit arrangement and to raise the operating frequency.

The Euclid processing module improvements in the invention have the other problem of the decrease of a logic scale. In order to package the Euclid processing module into an LSI, there is considered a method in which registers for the coefficients of $R_i(z)$ and $B_i(z)$ are disposed in two sorts for the dividend polynomial and the divisor polynomial and are cascade-connected to each other. A resource quantity required for the calculations of both $B_i(z)$ and $R_i(z)$ based on this technique, that is, the numbers of registers, and processing modules becomes/become as follows on the side of $R_i(z)$, in case of making the error corrections of t words:

Capacity of Register. Corresponding to $(2t+1) \times 2 = 4t+2$ coefficients

Galois field division unit . . . One

Galois field multiplication units . . . 2t

Galois field addition (exclusive "or") units . . . 2t

Besides, on the side of $B_i(z)$, a resource quantity becomes as follows:

Capacity of Register. Corresponding to $(t+1) \times 2 = 2t+2$ coefficients

Galois field division unit . . . Zero

Galois field multiplication units . . . (t+1)

Galois field addition (exclusive "or") units . . . (t+1)

The addition of both the resource quantities becomes:

Capacity of Registers . . . Corresponding to $(3t+1) \times 2 = 6t+2$ coefficients Galois field division unit . . . One Galois field multiplication units . . . (3t+1)

Galois field addition (exclusive "or") units . . . (3t+1)

The decrease of resources leads to the decrease of the logic scale. Hereinafter, in describing this embodiment, the above resource quantity shall be termed the "basic resource quantity" and will be used for comparisons.

To sum up, the improvements in the Euclid processing module on this occasion have for their objects to simplify the controlling circuit configuration for raising the operating frequency with, for example, the minimum latency (2t steps), and to decrease the resource quantity for the reduction of the logic scale.

Heretofore, a large number of circuit configurations have been contrived as the Euclid processing modules. However, when the Euclid processing module is created for RS code, it is applicable for BCH code directly without requiring any circuit alteration, so that most inventions are for the RS code. Therefore, when these inventions are viewed as being dedicated to the BCH code, they are circuit configurations which have room for the optimization yet. In order to explain this point, the two of JP-A-5-165662 (Patent Document 1) and JP-A-7-240692 (Patent Document 2) will be used as examples.

First, the technique of JP-A-5-165662 will be stated. Patent Document 1 contains statements concerning a non-multiplexed case (of short latency) and a multiplexed case (of long latency). In this embodiment, however, a target is to shorten a latency (to make the minimum 2t steps sufficient), and hence, the non-multiplexed case will be described.

The technique of JP-A-5-165662 realizes Euclid calculations with a small quantity of resources as indicated below by way of example.

Capacity of Registers . . . Corresponding to (4t+3) coefficients

Galois field division unit . . . One

Galois field multiplication units . . . (2t+1)

Galois field multiplication (exclusive "or") units . . . (2t+1)

For the purpose of effectively using the small quantity of resources, however, signals need to be sent to individual switches (selectors) in a control circuit by executing complicated processes as indicated in Table 5.

TABLE 5

| Calculation mode | Condition of jth processing module | Switch $7_j$ | Switch $8_j$ | Switch $6_j$ |
|---|---|---|---|---|
| CROSS MODE (HAVING CALCULATION MODES 1 TO 3) dR < dQ AND COEFFICIENT OF DRTH DEGREE OF R(x) ≠ 0 | | | | |
| 1 | $0 < j \leq \min(dR, dQ)$ | 1 | 0 | 0 |
| 2 | $\min(dR, dQ) < j \leq \max(dR, dQ)$ | 1 | 1 | 0 |
| 3 | $\max(dR, dQ) < j$ | 0 | 0 | 1 |
| NORMAL MODE (HAVING CALCULATION MODES 4 TO 6) dR ≥ dQ OR COEFFICIENT OF DRTH DEGREE OF R(x) = 0 | | | | |
| 4 | $0 < j \leq \min(dR, dQ)$ | 0 | 0 | 0 |
| 5 | $\min(dR, dQ) < j \leq \max(dR, dQ)$ | 0 | 1 | 0 |
| 6 | $\max(dR, dQ) < j$ | 1 | 0 | 1 |

Here, a suffix "j" denotes the No. of the processing module, and $1 \leq j \leq (2t-1)$ holds. This technique is configured of (2t−1) processing modules, and each processing module has three sorts of selectors. In consequence, the selectors in (2t−1)×3 sorts in total are controlled in six calculation modes. When the control circuit is made complicated by employing a large number of inequality signs in this manner, the operating frequency becomes low. Moreover, with this technique, the (2t−

1) processing modules are individually controlled. Therefore, the circuit scale increases though not in Galois field calculations.

The technique of JP-A-7-240692 being the other example is improvements in a systolic algorithm (pp. 420-428, 1st Issue, VoL. J69-A No. 3 in Proceedings '86 of the Institute of Electronics and Communication Engineers: "Method for configuring Decoder of Reed-Solomon codes based on Systolic algorithm"). In this technique, the protection of the (difference of degrees)>1 is considered, and the controlling circuit is simplified. Therefore, the operating frequency is comparatively high, and it is supposed that, with this technique, a delay problem will be difficult to occur even in a device of low unit price and low performance.

The technique of JP-A-7-240692, however, requires a large quantity of resources as indicated below.

Capacity of Registers. Corresponding to (11t−3) coefficients
   Galois field division unit . . . Zero
   Galois field multiplication units . . . (4t−2)
   Galois field multiplication (exclusive "or") units . . . (2t−1)

Further, with this technique, the calculation of the error locator polynomial σ(z) is started after the calculation of the error evaluator polynomial ω(z), so that the latency becomes long. Incidentally, when improvements are added so as to make the latency 2t steps with this technique, the resource quantity increases as indicated below.

Capacity of Registers. Corresponding to (22t−6) coefficients
   Galois field division unit . . . Zero
   Galois field multiplication units . . . (8t−4)
   Galois field multiplication (exclusive "or") units . . . (4t−2)

With this resource quantity, a circuit scale in the case of application to concatenated codes is excessively gigantic and is scanty of realizability.

Figure 23:
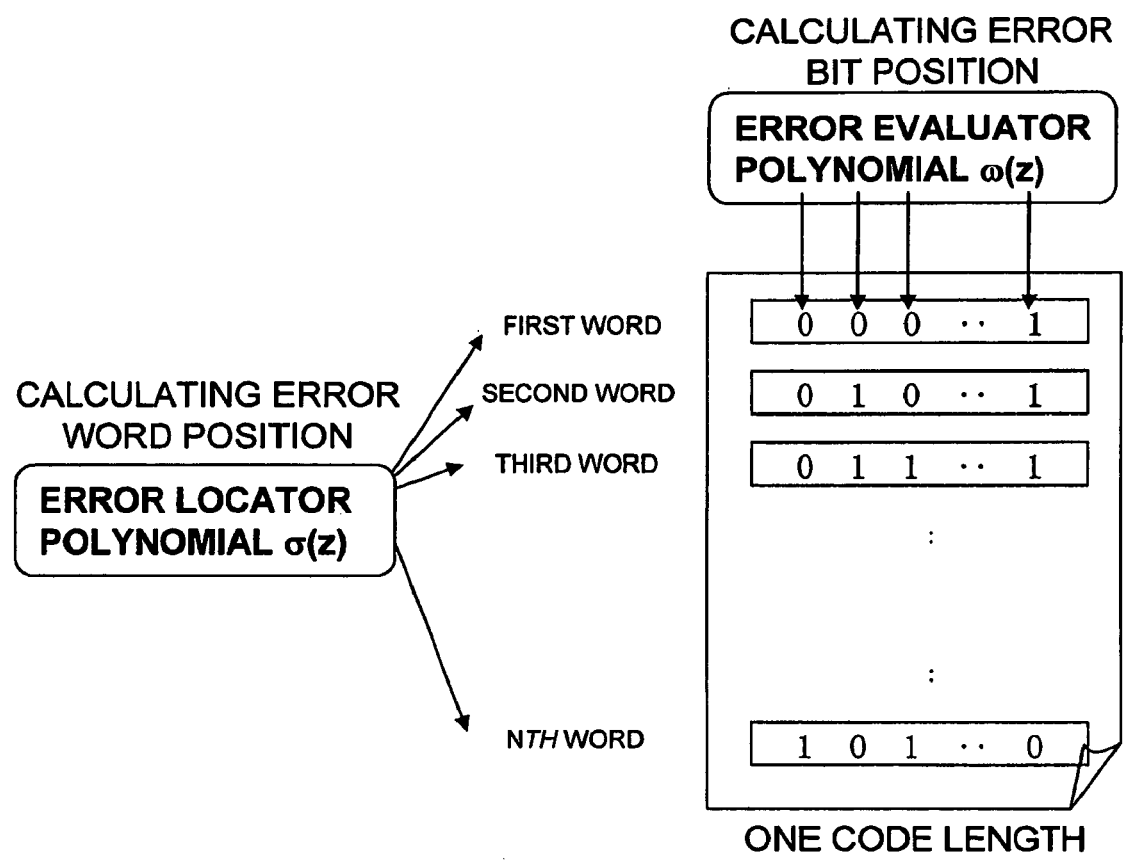
FIG. 23 is a diagram showing the roles of an error locator polynomial and an error evaluator polynomial.

The Euclid processing module for the RS code has the circuit configuration which calculates the error locator polynomial σ(z) and the error evaluator polynomial ω(z) as its functions. As shown in FIG. 23, the error locator polynomial σ(z) serves to calculate which word is an error, whereas the error evaluator polynomial ω(z) calculates which bit is an error. Therefore, the BCH code being binary (one word=one bit) have the property that only the error locator polynomial σ(z) is necessary and that the error evaluator polynomial ω(z) is unnecessary. That is, the above technique includes a calculation circuit which calculates all the coefficients of the error evaluator polynomial ω(z) unnecessary for the BCH code, and this incurs the increase of the circuit scale and the lowering of the operating frequency and forms one of causes for making adaptation to the concatenated codes difficult.

However, whether the Euclid processing module is dedicated to the RS code or to the BCH code, the calculation circuit of the error evaluator polynomial ω(z) cannot be indiscriminately detached from the Euclid processing module. Although repeatedly explained, this is ascribable to the fact that the quotient polynomial $Q_i(z)$ which is calculated in the course of computing $R_i(z)$ to become the candidate of the error evaluator polynomial ω(z) is required for calculating $B_i(z)$ to become the candidate of the error locator polynomial σ(z).

Therefore, when a circuit configuration which calculates only the necessary error locator polynomial σ(z) can be formed by any technique, resources which are originally surplus for the BCH code can be decreased.

For complying with the requirement, the invention has for its object to provide an apparatus, a method and an algorithm which can calculate the necessary $B_i(z)$ without executing some of the calculations of $R_i(z)$.

2. Calculations of Embodiment

Figure 24:
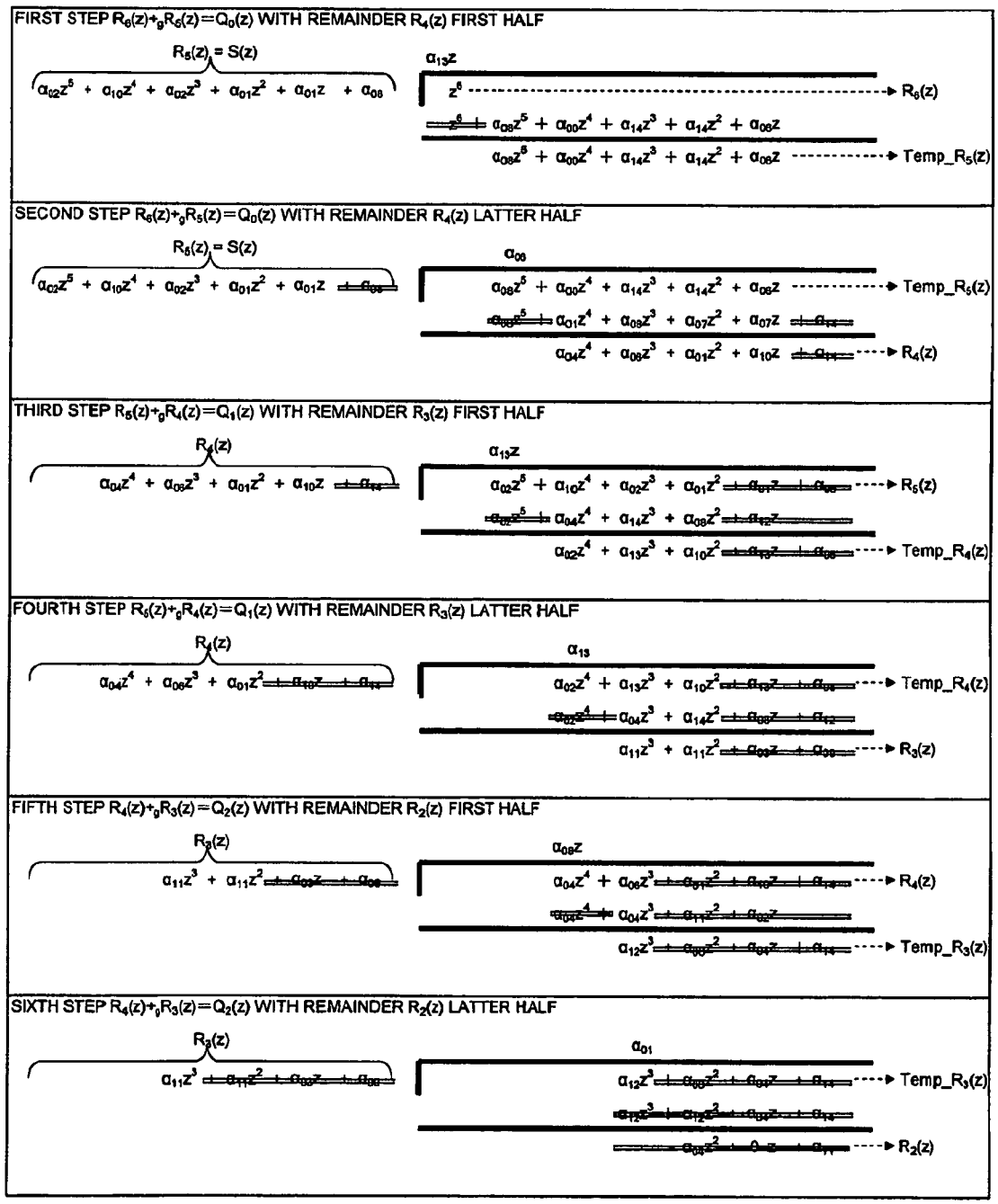
FIG. 24 shows an example in which the computations of necessary $R_i(z)$ and the computations of unnecessary $R_i(z)$ are indicated.

FIG. 24 is a diagram for explaining the computations of necessary $R_i(z)$ and the computations of unnecessary $R_i(z)$.

In the computations between polynomials, the computations of $R_i(z)$ are necessary for obtaining the certainly necessary $B_i(z)$. In actuality, however, when the computations are viewed in terms of the calculations of individual coefficients, it is understood that the calculations of all the coefficients of the $R_i(z)$ are not necessary. For the brevity of description, the above computational example of $R_i(z)$ and $B_i(z)$ at t=3 will be referred to and will now be described reversely from the sixth step in conjunction with FIGS. 24 and 21.

It is as stated before that the quotients $Q_i(z)$ are necessary for the calculations of $B_i(z)$. Conversely speaking, when only the values of the necessary quotients $Q_i(z)$ are found, all the $R_i(z)$ calculations need not be executed. At the sixth step of this example, the following calculation is executed on the side of $B_i(z)$ (refer to FIG. 21):

$$B_3(z)=\text{Temp}\_B_3(z)+\alpha_1 B_2(z) \tag{35}$$

On the side of $R_i(z)$, a quotient $\alpha_{01}=\alpha_{12}/\alpha_{11}$ necessary for $B_i(z)$ has already been calculated by a Galois field division. At the sixth step, therefore, the multiplication and addition of a Galois field need not be executed on the $R_i(z)$ side. Parts where the calculations of the sixth step are unnecessary have doublets drawn as shown in FIG. 24.

At the fifth step, the following calculation is executed on the $B_i(z)$ side:

$$\text{Temp}\_B_3(z)=B_1(z)+\alpha_3 B_2(z) \tag{36}$$

On the $R_i(z)$ side, a quotient $\alpha_8=\alpha_4/\alpha_{11}$ has already been calculated by a Galois field division. Besides, since $\alpha_{12}$ is used in the Galois field division of the next sixth step, only the multiplication and addition of a ternary Galois field need to be executed. However, the calculations of Galois fields except the ternary one are not required. At the fifth step in FIG. 24, therefore, doublets are drawn except in the ternary field.

Similarly, the fourth step will be described. Here, only the ternary and binary calculations are required. The reason therefor is that the result $\alpha_{11}$ of the ternary calculation becomes the denominator of the Galois field division $\alpha_4/\alpha_{11}$ at the fifth step, and that the result $\alpha_{11}$ of the binary calculation is used in the ternary calculation $\alpha_{12}=\alpha_6+\alpha_8\times\alpha_{11}$ at the fifth step. In the same manner, when the number of steps is returned to the first step here, a coefficient which need not be calculated is also existent at any step. In FIG. 24, the unnecessary calculation at each step is indicated by the doublet.

As a result, the respective numbers of times of the calculations of the multiplications and additions of the Galois fields of $R_i(z)$ as are required for $B_i(z)$ become 5 at the first step, 4 at the second step . . . , one at the fifth step, and zero at the sixth step.

On the other hand, as shown in FIG. 21, the numbers of times of the calculations of the multiplications and additions of the Galois fields of $B_i(z)$ enlarge as the number of steps increases. In other words, the Euclid processing module can be optimized for the BCH code if a control method in which the unnecessary calculations of $R_i(z)$ are stopped in accordance with the numbers of steps and in which the multiplications and additions of the Galois fields of the corresponding parts are utilized for the calculations of $B_i(z)$ is realized. Hereinafter, this control shall be called the "adjustments of the processing modules of $R_i(z)$ and $B_i(z)$. Besides, regarding registers in which the coefficients are stored, components by which the coefficients of $R_i(z)$ decrease are allotted to components by which the coefficients of $B_i(z)$ increase, whereby the registers can be effectively utilized.

However, (3) the adjustments of the processing modules of $R_i(z)$ and $B_i(z)$ have been added anew to the two controls having heretofore been performed; (1) the substitution of polynomials and (2) the protection of the (difference of degrees)>1. Therefore, it is naturally possible that a circuit configuration will become complicated to hamper the optimization conversely. Nevertheless, in this embodiment, this control can be realized with a simple configuration by a technique concretely indicated below, and a circuit which decreases resources still further can be provided.

3. Hardware Configuration

An error correction decoding circuit a3 in this embodiment includes, for example, a configuration shown in FIG. 13. By way of example, the error correction decoding circuit a3 includes a syndrome processing module a21, a Euclid processing module a22, a chien search unit a23, an error correction unit a24, a delay circuit a20, and an inverse element ROM a25. Incidentally, the inverse element ROM a25 may well be included in the Euclid processing module a22.

The error correction decoding circuit may well have a configuration shown in FIG. 15 or FIG. 17 by way of example. In the configuration of FIG. 17, the error correction decoding circuit includes a plurality of syndrome processing modules a21 and error correction units a24, respectively, for a Euclid processing module a40. The Euclid processing module a40 receives syndrome polynomials from the plurality of syndrome processing modules a21 and obtains error locator polynomials. Besides, the Euclid processing module a40 outputs the obtained error locator polynomials to the error correction units a24 through chien search units a23 which correspond to the syndrome processing modules a21.

Figure 1:
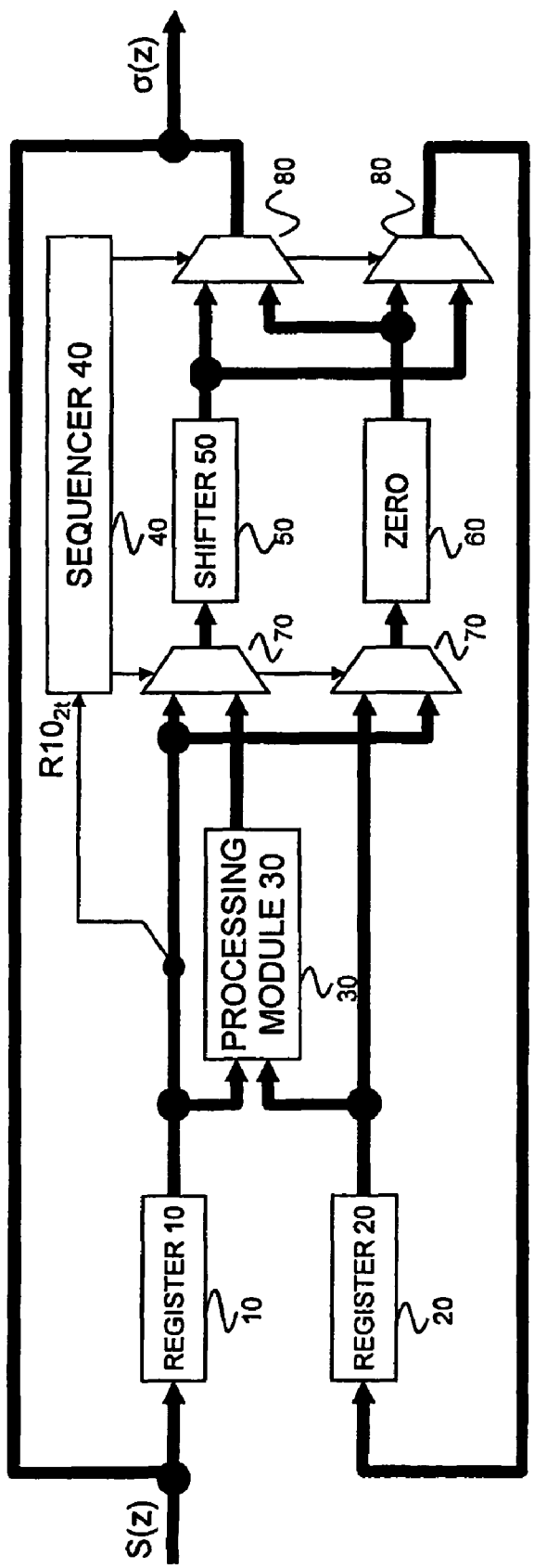
FIG. 1 is a diagram of a circuit configuration in the present invention.

FIG. 1 is a configurational diagram of the Euclid processing module a22 or a40 in this embodiment. A circuit configuration for realizing an algorithm will be stated with reference to FIG. 1.

The Euclid processing module includes a register 10 (first register), a register 20 (second register), a processing module 30, a sequencer (controller) 40, a shifter 50, a zero insertion unit 60, and selectors 70 and 80.

FIG. 25 is a diagram for explaining the register 10 and the register 20.

First, the registers 10 and 20 will be described. In actuality, it is more convenient to put the coefficients of $R_i(z)$ and $B_i(z)$ together and to handle them. Therefore, those coefficients of a virtual polynomial into which the above coefficients are put together will be discussed. First, initial values as indicated in FIG. 25 are substituted into the register 10 and the register 20. Here, the coefficients of the syndrome polynomial of Formula 21 are exemplified as the initial values. On this occasion, #6 to #1 of the register 10 are the coefficients of $R_5(z)$, and #0 is the coefficient of $B_0(z)$, while #6 to #1 of the register 20 are the coefficients of $R_6(z)$, and #0 is the coefficient of $B_{-1}(z)$.

The coefficients of $R_i(z)$ and $B_i(z)$ are collected in this manner, whereby the capacity of necessary registers is decreased from (6t+4) to (4t+2) as compared with the basic resource quantity, and also the number of times of the multiplications and additions of Galois fields is decreased from (3t+1) to (2t+1). In actuality, however, the multiplication and addition of the coefficients of the highest degree #2t of the polynomial are unnecessary as shown in FIG. 24, and hence, the numbers of times of these calculations become 2t, with the result that the numbers of the multiplication units and addition units of the Galois fields become 2t, respectively.

Figure 2:
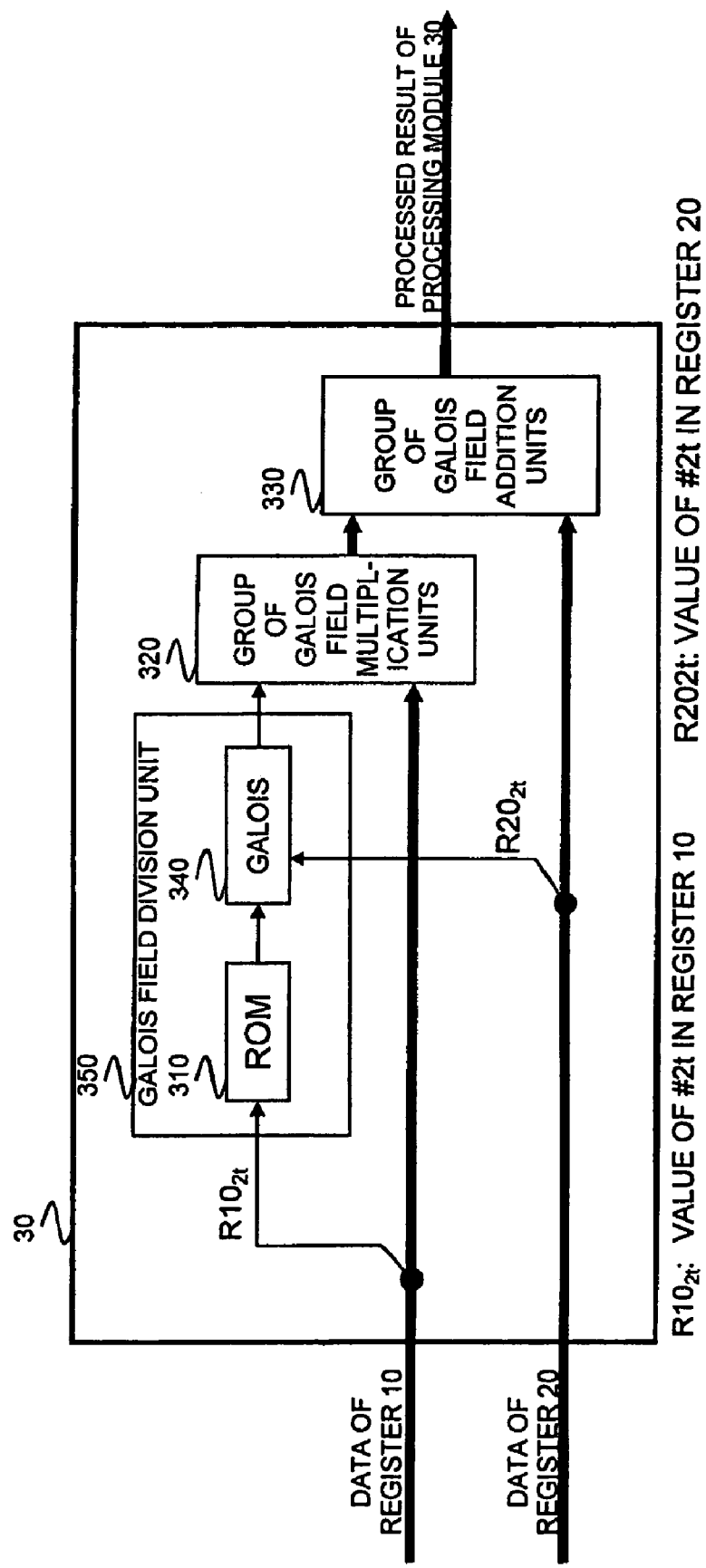
FIG. 2 is a diagram of the circuit configuration of a processing module 30.

FIG. 2 is a configurational diagram of the processing module 30.

Next, the circuit configuration of the processing module 30 in FIG. 1 will be described with reference to FIG. 2. When the calculations of the first step in FIGS. 24 and 21 are taken as examples, the following calculations of Galois fields are executed in the processing module 30:

$$\alpha_{13}z = z^6/\alpha_2 z^5 \tag{37}$$

$$\text{Temp\_}R_5(z) = R_6(z) + \alpha_{13}zR_5(z) \tag{38}$$

$$\text{Temp\_}B_1(z) = B_{-1}(z) + \alpha_{13}zB_0(z) \tag{39}$$

As shown in FIG. 2, the processing module 30 includes a Galois field inverse element ROM 310, Galois field multiplication units 340 and 320, and a Galois field addition unit 330. Incidentally, the inverse element ROM 310 and the Galois field multiplication unit 340 in FIG. 2 correspond to the Galois field division unit stated above. The Galois field division of the coefficients of Formula (37) which is first executed is changed into a multiplication with an inverse element value as:

$$\alpha_0 \times (1/\alpha_2) \tag{40}$$

Here, $1/\alpha_2$ is the inverse element value of $\alpha_2$. As the inverse element values, values which are previously registered in a memory as shown in the table of FIG. 11 can be used. Hereinafter, the memory shall therefore been called the "inverse element ROM". As shown in FIG. 11, the inverse element value of $\alpha_2$ becomes $\alpha_{13}$.

Subsequently, the following multiplication parts of Formulas 38 and 37 are executed by the group of Galois field multiplication units in FIG. 2:

$$\alpha_{13}z \times R_5(z) \tag{41}$$

$$\alpha_{13}z \times B_0(z) \tag{42}$$

The multiplication units exist, for example, in the number of 2t in the current case.

Lastly, $R_6(z)$ and $B_{-1}(z)$ are added to $\alpha_{13}zR_5(z)$ and $\alpha_{13}zB_0(z)$ outputted from the Galois field multiplication unit group 320, by the Galois field addition unit group 330 in FIG. 2, thereby to output Temp\_$R_5(z)$ and Temp\_$B_1(z)$. Also, the number of the Galois field adders is, for example, 2t. Since the coefficients of $R_i(z)$ and $B_i(z)$ are collected, a circuit produces outputs as indicated in Table 6.

TABLE 6

| | #6 | #5 | #4 | #3 | #2 | #1 | #0 |
|---|---|---|---|---|---|---|---|
| Processing module output | 0 | $\alpha_{08}$ | $\alpha_{00}$ | $\alpha_{14}$ | $\alpha_{14}$ | $\alpha_{06}$ | $\alpha_{13}$ |

Here, #5 to #1 in Table 6 indicate Temp\_$R_5(z)$, and #0 indicates Temp\_$B_1(z)$.

Figure 3:
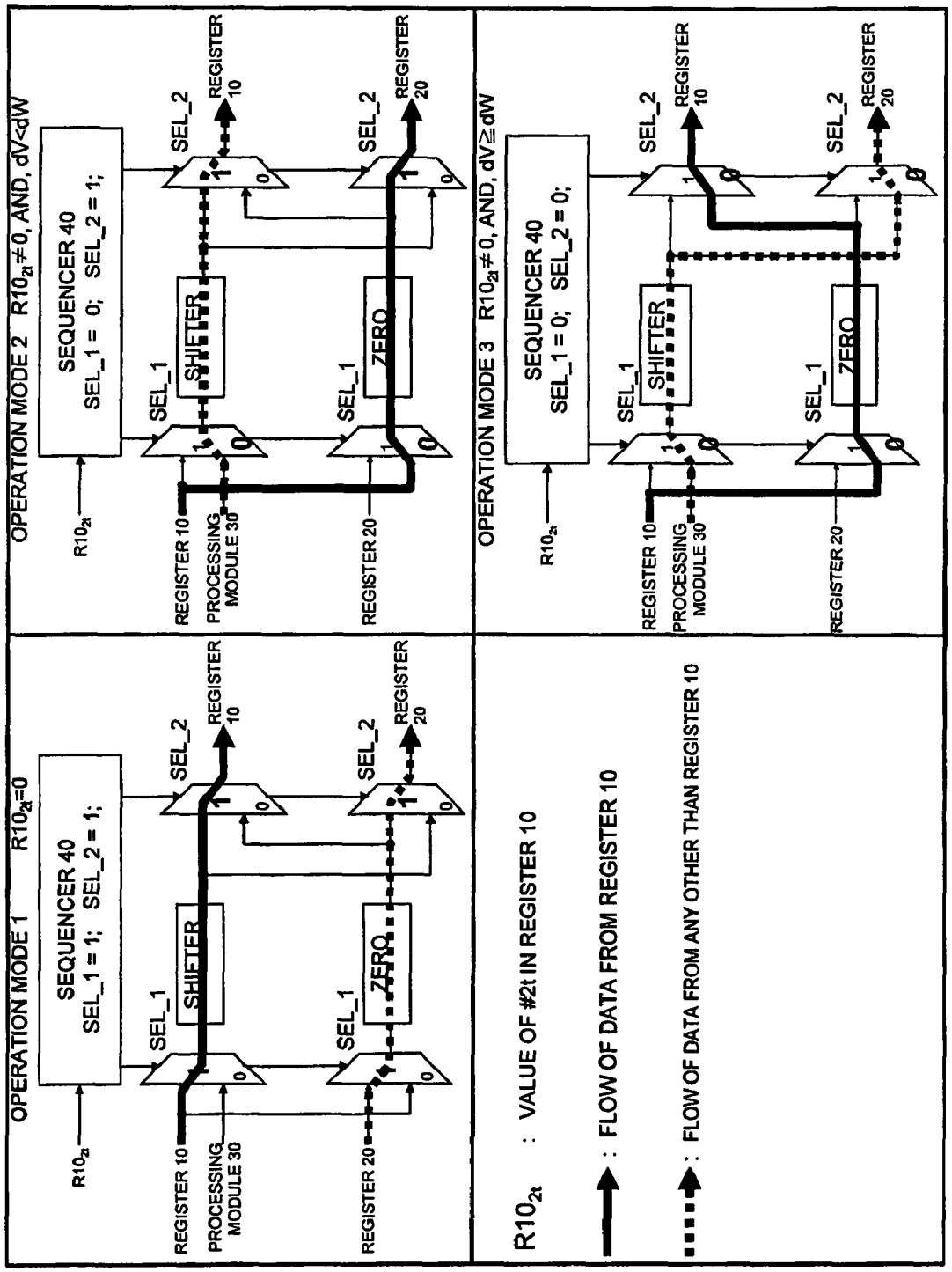
FIG. 3 is a diagram showing the flows of data in respective processing modes.

FIG. 3 is a diagram for explaining processing modes.

Next, the sequencer 40, and the selectors 70 and 80 which are controlled by them will be described. The sequencer 40 has the virtual degrees of the dividend polynomial and the divisor polynomial as internal variables (the degrees are virtual to the last, and differ from actual values), and it receives the value of #2t of the register 10 as an input signal. Here, variables (parameters) are defined as follows:

$dV$=virtual degree of dividend polynomial (initial value is 0); (43)

$dW$=virtual degree of divisor polynomial (initial value is 0); (44)

$R10_{2t}$=value of #2t of register 10; (45)

The sequencer 40 creates the following three processing modes from dV, dW and $R10_{2t}$, and it controls the selectors 70 and 80 as in Table 7 in accordance with the processing modes:

TABLE 7

| | PROCESSING MODE | | SEL__1 | SEL__2 |
|---|---|---|---|---|
| 1 | $R10_{2t} = 0$ | | 1 | 1 |
| 2 | $R10_{2t} \neq 0$ | dV < dW | 0 | 1 |
| 3 | | $dV \geqq dW$ | 0 | 0 |

Here, "SEL__1" indicates the control signal of the selector 70, and "SEL__2" that of the selector 80. The control circuit of JP-A-5-165662 as indicated in Table 5 has had the six processing modes, and has controlled (2t−1)×3 sorts of selectors. In contrast, in the control circuit of this embodiment, the number of processing modes is three, and the selectors controlled are of only two sorts. Also in this point, the control circuit of this embodiment is sharply simplified.

Incidentally, dV and dW change in values every mode as follows:

At processing mode 1 $dV=dV+1$;   (46)

At processing mode 2 $dV=dW$;   (47)

At processing mode 3 $dW=dW+1$;   (48)

FIG. 3 shows the flow of data which have been controlled by the sequencer 40. In the examples of the first steps in FIGS. 24 and 21, $R10_{2t}$, that is, the value of #6 of the register 10 is $\alpha_2 \neq 0$, and dV and dW have initial values "0" each other, so that the processing mode 3 is established. In the operation mode 3, the sequencer 40 outputs SEL__1=0 so as to assert "0" of the selector 70, and it outputs SEL__2=0 so as to assert "0" of the selector 80. Consequently, an output from the processing module 30 is stored in the register 20 through the shifter 50, and the value of the register 10 is stored in the register 10 again through the zero insertion unit 60.

In the operation mode 2, the sequencer 40 outputs SEL__1=0 so as to assert "0" of the selector 70, and it outputs SEL__2=1 so as to assert "1" of the selector 80. Consequently, an output from the processing module 30 is stored in the register 10 through the shifter 50, and the value of the register 10 is stored in the register 20 through the zero insertion unit 60.

In the operation mode 1, the sequencer 40 outputs SEL__1=1 so as to assert "1" of the selector 70, and it outputs SEL__2=1 so as to assert "1" of the selector 80. Consequently, the value of the register 10 is stored in the register 10 again through the shifter 50, and the value of the register 20 is stored in the register 20 again through the zero insertion unit 60.

Next, the shifter 50 in FIG. 1 will be described. The shifter 50 shifts coefficients as indicated in Table 8, by one leftward as indicated in Table 9. In the above example of the first step, the output from the processing module 30 is shifted. This processing is a control for putting the highest degree coefficient of $R_t(z)$ into #6 (in general, #2t) of the register at all times, and for collectively subjecting the coefficients of the respective degrees in the dividend polynomial and the divisor polynomial, to Galois field processing in the processing module 30.

TABLE 8

| | #6 | #5 | #4 | #3 | #2 | #1 | #0 |
|---|---|---|---|---|---|---|---|
| Before shift | 0 | $\alpha_{08}$ | $\alpha_{00}$ | $\alpha_{14}$ | $\alpha_{14}$ | $\alpha_{06}$ | $\alpha_{13}$ |

TABLE 9

| | #6 | #5 | #4 | #3 | #2 | #1 | #0 |
|---|---|---|---|---|---|---|---|
| After shift | $\alpha_{08}$ | $\alpha_{00}$ | $\alpha_{14}$ | $\alpha_{14}$ | $\alpha_{06}$ | $\alpha_{13}$ | 0 |

Next, the zero insertion unit 60 in FIG. 1 will be described. The zero insertion unit 60 has a scheme for erasing the value of the # of the number of steps. By way of example, when the number of steps is "1", the coefficient value of #1 among the coefficients of Table 10 is erased as indicated in Table 11. Likewise, when the number of steps is "n", the #nth coefficient is erased. This scheme is a control for stopping the unnecessary calculations of $R_t(z)$ in accordance with the number of steps, and for utilizing the Galois field multiplications and additions of the corresponding part for the calculations of $B_t(z)$. In the example of Step 1 here, the coefficient value $\alpha_8$ of $R_5(z)$ is erased. As cleared by the description made in conjunction with FIG. 24, this value $\alpha_8$ is no longer used at the next step 2. Therefore, the value of the #1 of the memory is set at zero so that the coefficient of $B_t(z)$ can be inputted at Step 2.

TABLE 10

| | #6 | #5 | #4 | #3 | #2 | #1 | #0 |
|---|---|---|---|---|---|---|---|
| Before erase of value | $\alpha_{02}$ | $\alpha_{10}$ | $\alpha_{02}$ | $\alpha_{01}$ | $\alpha_{01}$ | $\alpha_{08}$ | $\alpha_{00}$ |

TABLE 11

| | #6 | #5 | #4 | #3 | #2 | #1 | #0 |
|---|---|---|---|---|---|---|---|
| After erase of value | $\alpha_{02}$ | $\alpha_{10}$ | $\alpha_{02}$ | $\alpha_{01}$ | $\alpha_{01}$ | 0 | $\alpha_{00}$ |

In this manner, the substitution controls of the dividend polynomial, the divisor polynomial and the remainder polynomial are performed in accordance with the processing mode 2 and the processing mode 3. In case of a control where the difference of degrees of the dividend polynomial and the divisor polynomial is, at least, 2, the control of the processing mode 1 is performed. In the case where the difference of degrees has become, at least, 2, the highest degree coefficient of the dividend polynomial seems as if it were zero (as if $R10_{2t}=0$ were held), when viewed from the circuit. The processing mode 1 is executed to perform the shifts until the (highest degree coefficient of the dividend polynomial)≠0 is reached, and to control the degree difference of the respective polynomials stored in the registers 10 and 20.

Figure 4:
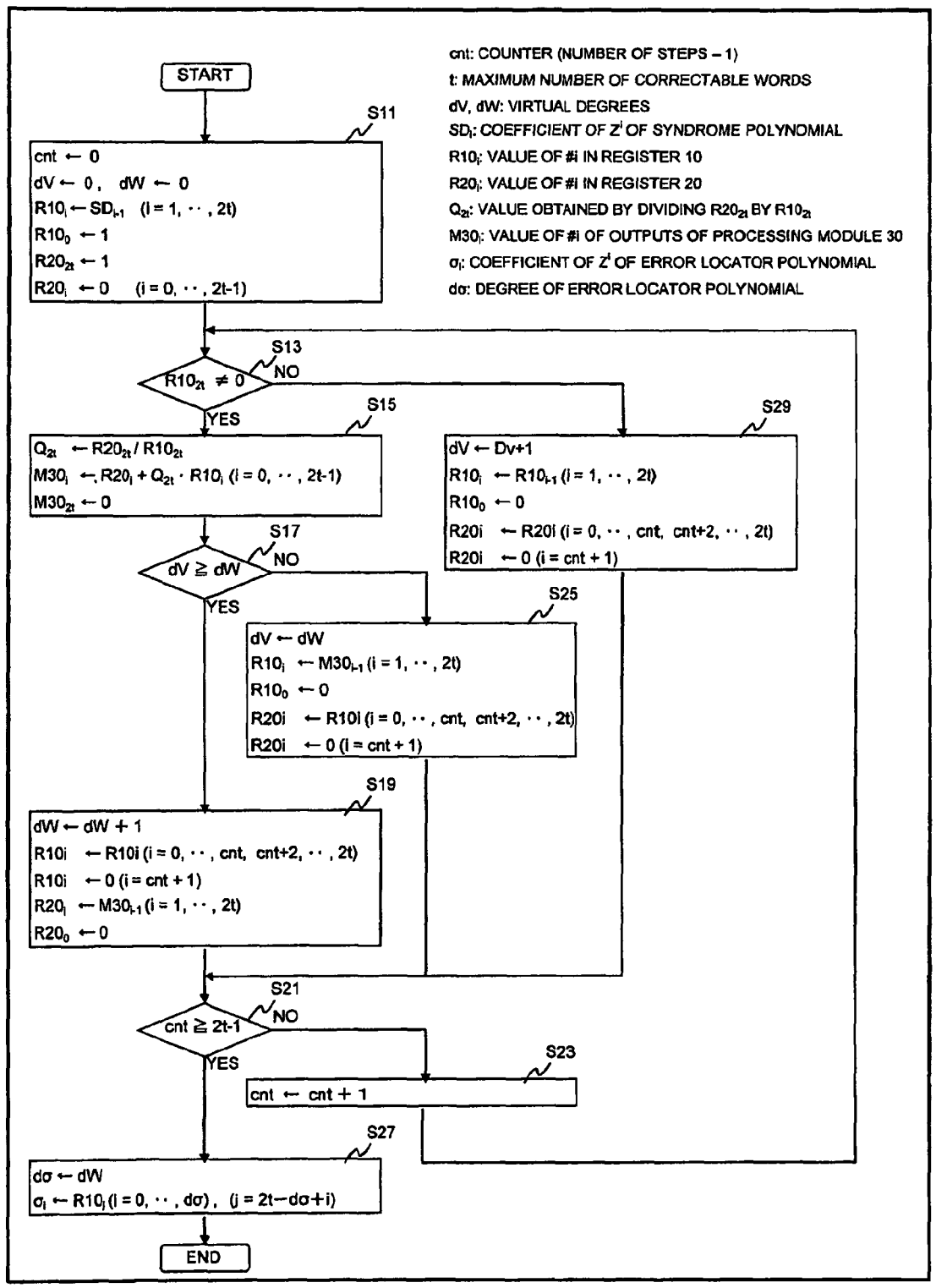
FIG. 4 is a flow chart in the invention.
Figure 5:
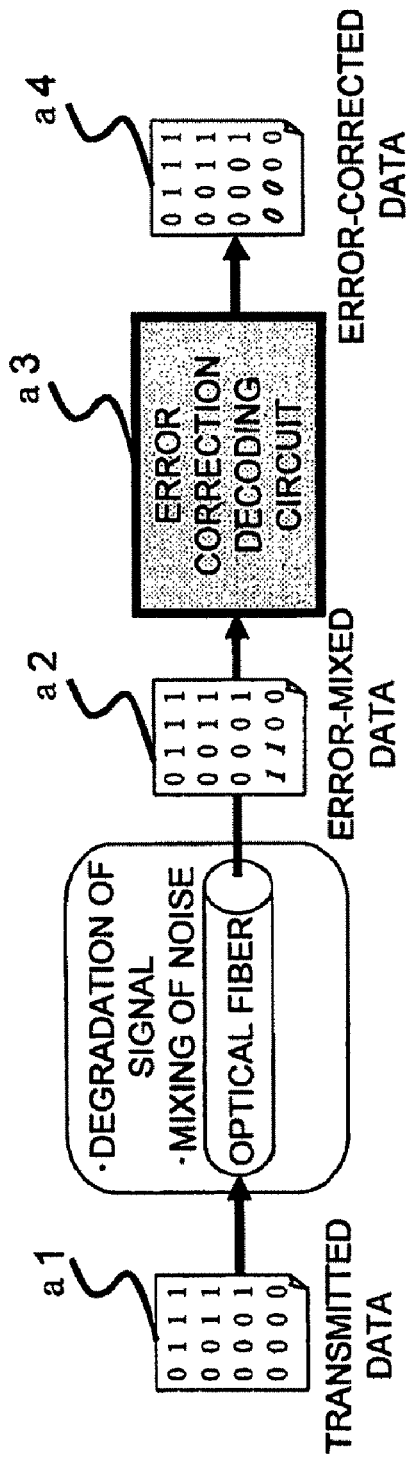
FIG. 5 is a schematic diagram of an error correction decoding circuit in optical communications.
Figure 6:
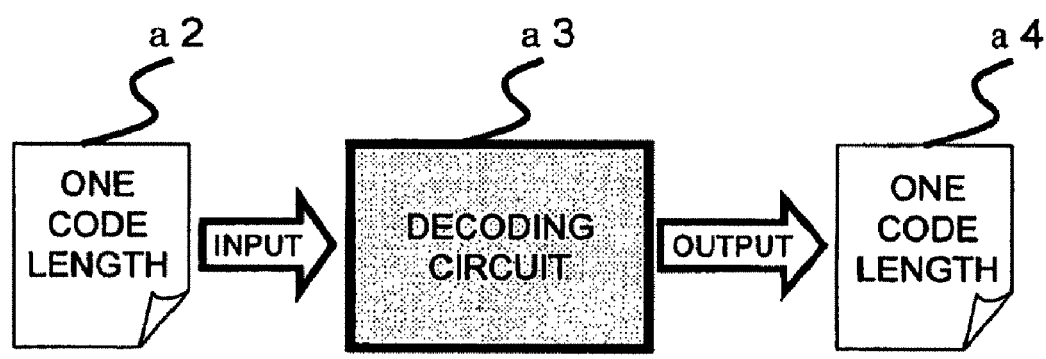
FIG. 6 is a diagram showing the processing unit of the decoding circuit.
Figure 7:
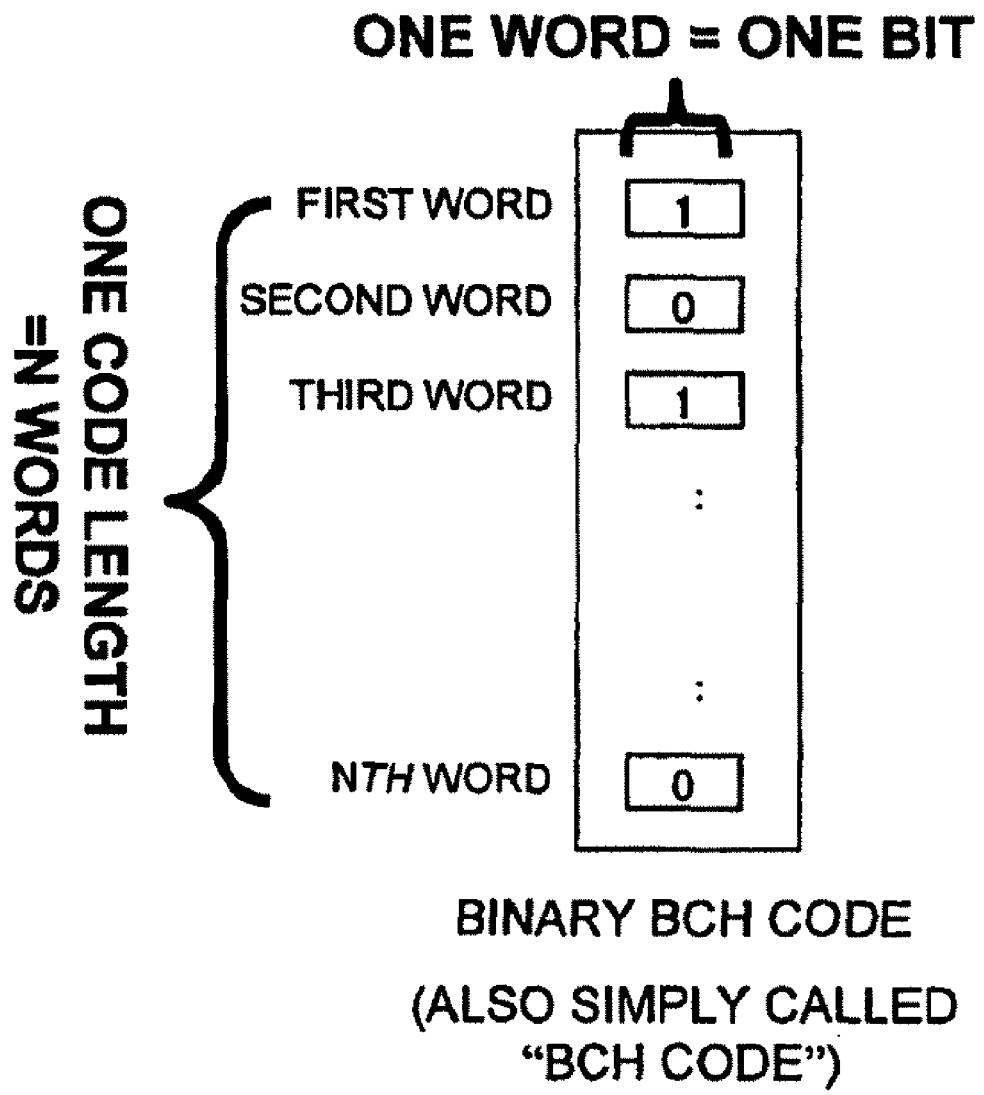
FIG. 7 is a diagram showing the configuration of one code length of binary BCH code (BCH code)
Figure 8:
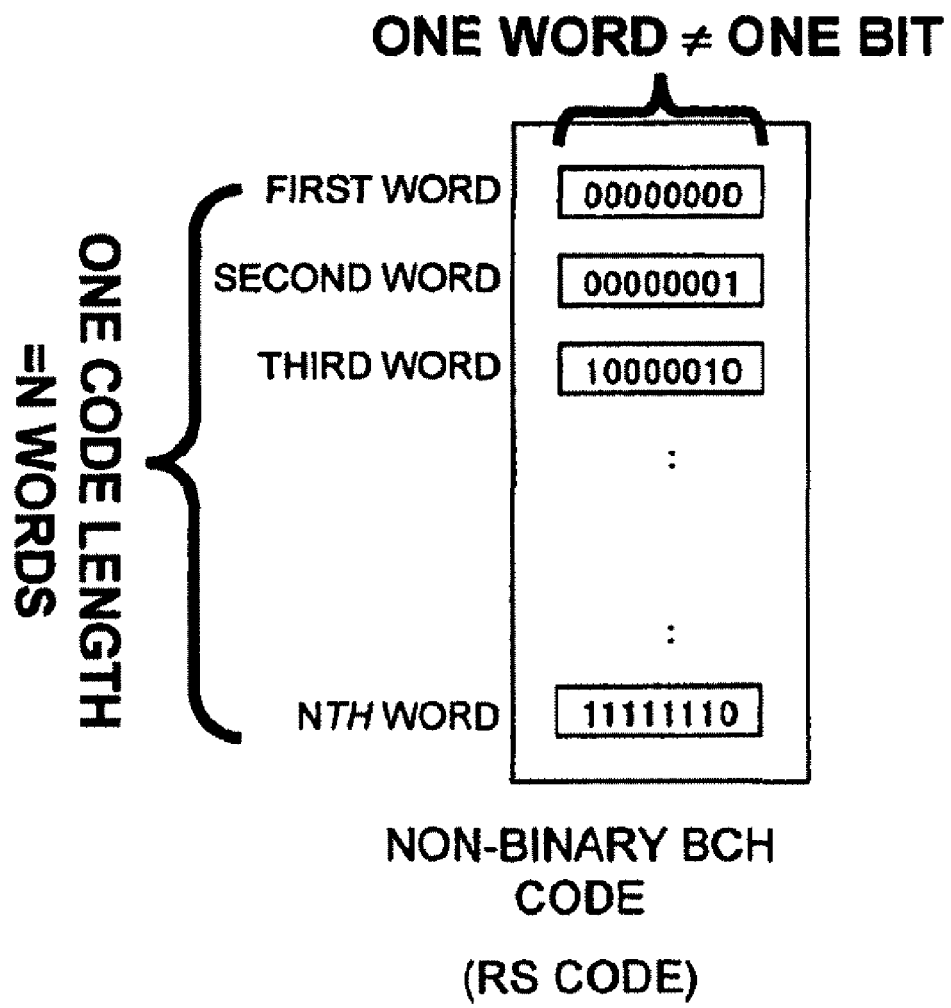
FIG. 8 is a diagram showing the configuration of one code length of non-binary BCH code (RS code)
Figure 12:
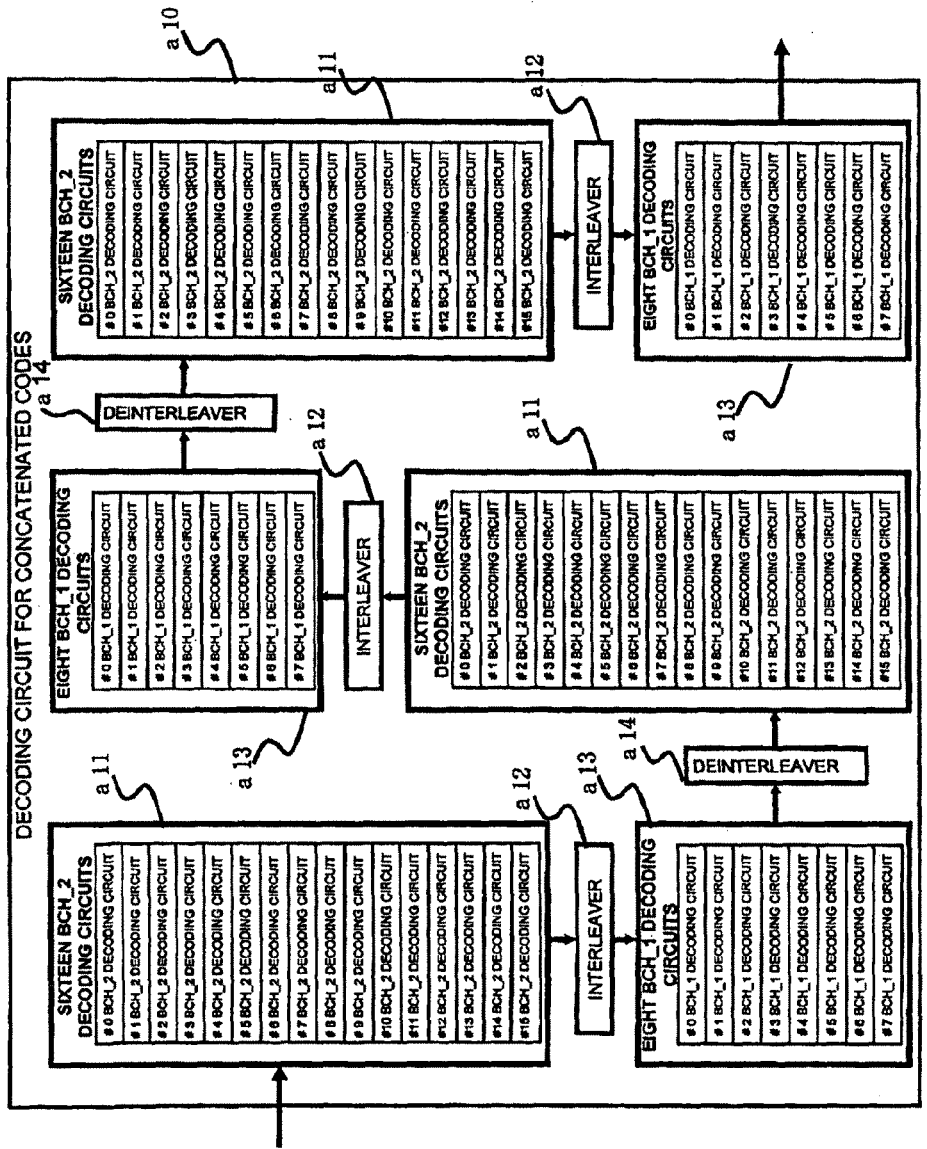
FIG. 12 is a diagram for explaining that decoding circuit of concatenated codes which is stated in Recommendation G. 975. 1 of the ITU-T.

FIG. 4 is a flow chart for explaining a series of operations in this embodiment.

Concrete examples of the operation of this embodiment will be described with reference to the flow chart of FIG. 4 and the examples of FIGS. 21, 24, 25, etc. By the way, in this embodiment, the normalization of $\sigma(z)=B_t(z)/B_t(0)$ is omitted. Besides, since the counter in FIG. 4 has started from zero, its value (cnt) becomes a value obtained by subtracting one from the number of steps in FIGS. 20 and 21. Besides, in the example of FIG. 25, the number t of words of error corrections is t=3.

First, the Euclid processing module a22 is initialized (step S1). By way of example, the sequencer 40 (or the zero insertion unit 60) sets the counter at zero (cnt=0). Besides, the sequencer 40 sets the parameters dV and dW at zero (dV=0, and dW=0). In addition, it stores the coefficients $SD_t$ of the inputted syndrome polynomial in the storage areas #1-#2t (hereinbelow, written as "#i") of the register 10 ($R10_i=SD_{i-1}$ (i=1, ..., and 2t)). An initial value "1" ($\alpha_{00}$) is stored in the #0 of the register 10 ($R10_0=1$). Besides, the initial value "1" ($\alpha_{00}$) is stored in the highest-degree #2t of the register 20 ($R20_{2t}=1$). An initial value "0" is stored in the #0-#2t-1 of the register 20 ($R20_i=0$ (i=0, ..., 2t-1)). Owing to the above processing, the registers 10 and 20 are set as the initial values of FIG. 25 by way of example.

Subsequently, if the coefficient of the highest degree #2t of the register 10 is not zero is judged by, for example, the sequencer 40 (step S13). If the coefficient is not zero, the flow shifts to a step S15, and if the coefficient is zero, the flow shifts to a step S29.

At the step S15, the processing module 30 obtains a quotient $Q_{2t}$ ($Q_{2t}=R20_{2t}/R10_{2t}$) in such a way that the coefficient stored in the highest degree #2t of the register 20 is Galois-field-divided by the coefficient stored in the highest degree #2t of the register 10. By way of example, the Galois field division is executed by the inverse element ROM 310 and the Galois field multiplication unit 340 in FIG. 2. At the first step, for example, the processing module 30 obtains a quotient $\alpha_{13}z$ in such a way that the coefficient "1" ($\alpha_{00}$) of the #6 of the register 20 is Galois-field-divided by the coefficient $\alpha_{02}$ of #6 of the register 10 (refer to the first step in FIG. 24 and the initial value in FIG. 25).

Besides, the processing module 30 Galois-field-multiplies the respective coefficients of the #0-#2t-1 of the register 10 and the obtained quotient $Q_{2t}$, and it Galois-field-adds the results of the multiplications and the respective coefficients of the #0-#2t-1 of the register 20 so as to output the results of the additions ($M30_i=R20_i+Q_{2t}\cdot R10_i$ (i=0, ..., 2t-1)). By way of example, the Galois field multiplications and additions are executed by the group 320 of Galois field multiplication units and the group 330 of Galois field addition units in FIG. 2. Incidentally, "0" may well be attached at the highest degree #2t to the result of the addition so as to deliver an output ($M30_{2t}=0$). At the first step, for example, the respective coefficients of the #1-#5 of the register 10 and the quotient $\alpha_{13}z$ are multiplied, and the resulting products are added to the respective coefficients of the #1-#5 of the register 20, whereby the respective coefficients of the remainder polynomial $Temp\_R_5(z)$ are obtained (refer to FIGS. 24 and 25). Besides, the coefficient of the #0 of the register 10 and the quotient $\alpha_{13}z$ are multiplied, and the resulting product is added to the coefficient of the #0 of the register 20, whereby the coefficient of the $Temp\_B_1(z)$ is obtained (refer to FIGS. 21 and 25). Incidentally, the processing of the $R_i(z)$ side and that of the $B_i(z)$ side can be collectively executed by the Galois field multiplication unit group 320 and the Galois field addition unit 330.

At a step S17, if the parameter dV is, at least, the parameter dW is judged by, for example, the sequencer 40. If dV is, at least, dW, the flow shifts to a step S19 corresponding to the operation mode 3, whereas if dV is not, at least, dW, the flow shifts to a step S25 corresponding to the operation mode 2. Incidentally, the flow shifts to a step S19 at the first step.

At the step S19, the sequencer 40 increases the parameter dW by one (dW=dW+1). Besides, among the storage areas of the register 10, one corresponding to (the value of the counter)+1 (cnt+1) is rewritten into "0" ($R10_i=0$ (i=cnt+1)). By way of example, among the respective coefficients from the register 10, the coefficient of the area corresponding to (the value of the counter)+1 is zeroized by the zero insertion unit 60, and the other coefficients are left intact and are written into the register 10 again. In the example of FIG. 25, the coefficient $\alpha_{08}$ of the #1 of the register 10 is rewritten into "0". Incidentally, as stated before, (the value of the counter+1) corresponds to the number of steps in FIGS. 21 and 24, etc. By the way, the above configuration may well be appropriately altered so as to delete the coefficients corresponding to the number of steps, in accordance with the initial value of the counter and a count technique.

Besides, the output of the processing module 30 is stored in the register 20. By way of example, the outputs $M30_{i-1}$ (i= 1, ..., and 2t) of the processing module 30 are stored in the #1-#2t of the register 20, and "0" is stored in the #0 of the register 20 ($R20_i=M30_{i-1}$ (i=1, ..., and 2t), and $R20_0=0$). By way of example, the shifter 50 shifts the results of additions with the respective coefficients of the #0 to #(2t-1) of the register 20 in the Galois field addition unit group 330, so as to be stored in the storage areas #1 to #2t of the register 10 or the register 20. Thus, the respective coefficients of $Temp\_R_5(z)$ and the coefficient of $Temp\_B_1(z)$ are stored in the register 20 (refer to "after 1 step" in FIG. 25).

At a step S21, if the value of the counter has become the predetermined number of times (2t-1) is judged by way of example. That is, if 2t times of steps have been repeated is judged. If the 2t times of steps have been repeated, the flow proceeds to a step S27. On the other hand, if the 2t times of steps have not been repeated, the counter is increased by one at a step S23 (cnt=cnt+1), and the steps of the step S13, et seq. are repeated.

Also at the second step, calculations are executed in the same manner as at the above steps S13 and S15 (refer to the second step in FIGS. 21 and 24). By way of example, at the second step, the processing module 30 Galois-field-divides the coefficient $\alpha_{08}$ of the #6 of the register 20 by the coefficient $\alpha_{02}$ of the #6 of the register 10 at the step S15, thereby to obtain a quotient a6 (refer to the second step in FIG. 24, and "after 1 step" in FIG. 25). Also, by way of example, at the second step, the respective coefficients of the #2-#5 of the register 10 and a quotient $\alpha_{06}$ are multiplied, and the resulting products are added to the respective coefficients of the #2-#5 of the register 20, whereby the respective coefficients of the remainder polynomial $R_4(z)$ are obtained (refer to FIGS. 24 and 25). Besides, the coefficient of the #0 of the register 10 and a quotient $\alpha_{13}z$ are multiplied, and the resulting product is added to the coefficients of the #0-#1 of the register 20, whereby the coefficients of $B_1(z)$ are obtained (refer to FIGS. 21 and 25). Besides, at the second step (even-numbered steps), it is judged at a step S17 that dV is not, at least, dW, and a step S25 is performed.

At the step S25, the sequencer 40 substitutes the value of the parameter dW into the parameter dV (dV=dW). Besides, among the coefficients of the register 10, the area thereof ass corresponds to (the value of the counter)+1 (cnt+1) is rewritten into "0", which is stored in the register 20 ($R20_i=R10_i$ (i=0, ..., cnt, cnt+2, ..., and 2t) and $R20_i=0$ (i=cnt+1)). By way of example, among the respective coefficients from the register 10, the coefficient of the area corresponding to (the value of the counter)+1 is zeroized by the zero insertion unit 60, and the other coefficients are left intact and are written into the register 20. In the example of FIG. 25, the coefficient $\alpha_{01}$ of the #2 of the register 10 is rewritten into "0", and the respective coefficients are stored in the register 20 (refer to "after 1 step" and "after 2 steps" in FIG. 25).

Besides, the output of the processing module 30 is stored in the register 10. By way of example, the outputs $M30_{i-1}$ (i=1, and 2t) of the processing module 30 are stored in the #1-#2t of the register 10, and "0" is stored in the #0 of the register 10 ($R10_i=M30_{i-1}$ (i=1, ..., and 2t) and $R10_0=0$). Thus, at the second step, the respective coefficients of $R_4(z)$ as have been obtained and the respective coefficients of $B_1(z)$ are stored in the register 10 (refer to "after 2 steps" in FIG. 25).

Also at the odd-numbered steps of the third step et seq., processing is executed in the same manner as at the first step stated above, and also at the even-numbered steps of the fourth step et seq., processing is executed in the same manner as at the second step stated above.

Incidentally, at the respective steps, when the coefficient of the highest degree #2t of the register 10 is "0" at the step S13, the flow shifts to the step S29 corresponding to the operation mode 1. At the step S29, the sequencer 40 increases the parameter dV by one (dV=dV+1). Besides, the storage areas of the coefficients of the register 10 are shifted ($R10_i = R10_{i-1}$ (i=1, ... , and 2t)), and "0" is stored in the #0 of the register 10 ($R10_0=0$). Besides, among the storage areas of the register 20, the area corresponding to (the value of the counter)+1 (cnt+1) is rewritten into "0", which is stored in the register 20 ($R20_i=R20_i$ (i=0, ... , cnt, cnt+2, ... , and 2t) and $R20_i=0$ (i=cnt+1)).

When the above processing is repeated 2t steps, the flow shifts to the step S27, at which the coefficients of the error polynomial among the coefficients stored in the register 10 are outputted. By way of example, the parameter dW is substituted into the degree dσ of the error locator polynomial. Besides, regarding i=0 to $d_\sigma$, a parameter "j" is obtained from j=2t−dσ+i, and the coefficient of the #j of the register 10 is outputted as the coefficient of $z^i$ of the error polynomial. In the example of FIG. 25, the coefficients stored in the #6-#3 of the register 10 (corresponding to $B_3(z)$ in FIG. 21) are outputted. Incidentally, at the last step, the calculated result ($B_3(z)$ in the example of FIG. 21) may well be directly outputted without being stored in the register 10.

Here, the calculated results of from the initial values to the sixth step are shown in FIG. 25 as concrete examples. In FIG. 25, the values of #1-#0 are the coefficients of $B_i(z)$ after one step, the values of #2-#0 after two steps ... , and the values of #6-#3 at the sixth step. In the example of the current time, the values of #6-#3 at the sixth step in FIG. 25 are the error locator polynomial σ(z) which is to be obtained. In general, the relations between the register 10 and the coefficients of the error locator polynomial σ(z) to be obtained become as shown in FIG. 26.

By way of example, the Euclid processing module a22 outputs the number of coefficients corresponding to the degree of the error locator polynomial among the coefficients outputted from the Galois field addition unit group 330 after the 2t steps or among the coefficients stored in the register 10 after the 2t steps, as the coefficients of the error locator polynomial. Besides, by way of example, among the coefficients stored in the first register after the 2t steps, (t+1) coefficients stored in storage areas #2t to #t are outputted as the coefficients of the error locator polynomial.

Owing to this embodiment, the three controls, namely, (1) the substitution of the polynomial, (2) the protection of (the difference of degrees)>1, and (3) the adjustments of the processing modules of $R_i(z)$ and $B_i(z)$ can be realized by the simplified circuit configuration, and the operating frequency can be heightened, while at the same time, the decreases of the Galois field calculations and the registers can be realized.

4. Performance Comparisons

Here will be discussed how much the improvements in the Euclid processing module of this embodiment have contributed to the decoding circuit of the concatenated codes in Recommendation G. 975. 1 of the ITU-T as stated at the beginning. Since, however, the statement of the entirety leads to a complicated explanation, comparisons will be confined to only a part at which the decoding circuits of BCH_2 are used in the number of 48.

Table 12 below indicates circuit scales, memories and operating frequencies after one Euclid processing module has been packaged into an LSI, before the improvements and after the improvements. Since the actual values of the logic scale and the operating frequency differ depending upon LSIs on which the processing module is mounted, only the comparisons of rough proportions will be made here. As a criterion, the logic scale of a unit of long latency before the improvements is set at 100. Incidentally, since packaging results are indicated, the unit of the latency has changed from steps to clocks, but the clocks have the same significance.

TABLE 12

| | Before improvements | | After improvements |
|---|---|---|---|
| Latency | Long About 250 clocks | Short 20 clocks | Short 20 clocks |
| Operating frequency | Low | Low | High |
| Logic scale | 100 | 200 | 140 |
| Memory | 22.5 kilobits | 22.5 kilobits | 22.5 kilobits |

In the specifications of the recommendation, the Euclid processing module of the BCH_2 must end processing within 255 clocks. In order to limit the latency of the Euclid processing module within 255 clocks, a contrivance is required to a corresponding extent, but a method therefor shall not be stated here.

Next, regarding these Euclid processing modules, let's consider a case where four decoding circuits are operating at one time as seen in FIG. 17. Then, circumstances become as indicated in Table 13. Here, each of the Euclid processing modules of short latencies is additionally provided with a circuit for adjusting the timings of input and output data between the preceding syndrome processing module and the succeeding chien search unit. In the Euclid processing module designed by the inventor, the logic scale of this circuit became, for example, 15. As understood also from Table 12, the Euclid processing module after the improvements is superior in all items to the units before the improvements.

TABLE 13

| | Before improvements | | After improvements |
|---|---|---|---|
| Latency | Long (About 250 clocks) | Short (20 clocks) | Short (20 clocks) |
| Number of Times of processing | One time (About 250 clocks) | Four times (80 clocks) | Four times (80 clocks) |
| Operating frequency | Low | Low | High |
| Logic scale | 100 × 4 = 400 | 200 + 15 × 4 = 260 | 140 + 15 × 4 = 200 |
| Memories | 22.5 × 4 = 90.0 kilobits | 22.5 kilobits | 22.5 kilobits |

Table 14 indicates comparisons at the part at which the decoding circuits of the BCH_2 are used in the number of 48. Unless 255 clocks are exceeded, Euclid's calculation process can be repeatedly used. Therefore, effects in the case of causing units of short latencies to execute the processing eight times are indicated on this occasion. In Table 14, "other units" correspond to all units other than the Euclid processing module as have been added up. Likewise, "other memories" signify memories used in others than the Euclid processing module as have been added up. By the way, in the inventor's design, the logic scale of the other unit logic becomes 125, and the memory thereof becomes about 22.3 kilobits, per decoding circuit.

TABLE 14

|  | Before improvements | After improvements | |
|---|---|---|---|
| Latency | Long (About 250 clocks) | Short (20 clocks) | Short (20 clocks) |
| Number of Times of Processing | One time (About 250 clocks) | Eight times (160 clocks) | Eight times (160 clocks) |
| Operating frequency | Low | Low | High |
| Logic scale | 100 × 48 = 4800 | 200 × 6 + 15 × 48 = 1920 | 140 × 6 + 15 × 48 = 1560 |
| Memories | 22.5 × 48 = 1080 kilobits | 22.5 × 6 = 135 kilobits | 22.5 × 6 = 135 kilobits |
| Logic scale of Other units | 6000 | 6000 | 6000 |
| Entirety | 10800 | 7920 | 7560 |
| Other memories | 540 kilobits | 540 kilobits | 540 kilobits |
| Memories of Entirety | 1620 kilobits | 675 kilobits | 675 kilobits |

In this manner, it is understood that, at the part at which the 48 BCH_2 decoding circuits are used, the logic scale and the memories have been respectively decreased about 30% and about 60% as a whole. Since, however, the values are somewhat different depending upon devices, actually the decrease rate of the logic scale is 20% to 30% in some cases.

Besides, as stated before, the Euclid processing module is more complicated as compared with any other unit, and hence, it is liable to form a factor for lowering the operating frequency of the whole circuit. Therefore, the performance of all of the 48 BCH_2 decoding circuits has also been bettered by the improvements of the Euclid processing module on this occasion.

In this manner, the improvements of the BCH encoding apparatus according to the invention are very useful in putting to practical use the concatenated codes which are forming the tributary stream of optical fiber communications, and they are considered to become still more important in the future. Of course, not only the communications, but also the enlargement of the number of the elements of BCH code, and the increase of the number of error correction words are thought to proceed in the future. Therefore, the invention is expected to be effectively utilized in all fields where error correction technology is employed.

The invention is applicable to, for example, error correction decoding in optical communications. Concretely, the invention is applicable in a field where the error correction decoding is performed using BCH code. Besides, the invention is applicable to error corrections in the fields of communications, computers, audios/videos, etc.

The invention claimed is:

1. A processing module for obtaining an error locator polynomial of a BCH code in an error correction decoding circuit in which error corrections of t words are performed using the error locator polynomial, where t denotes a predetermined integer, the processing module comprising:
a first register including $0^{th}$ to $2t^{th}$ storage areas, coefficients of a syndrome polynomial being initially stored in the $1^{st}$ to $2t^{th}$ storage areas of the first register;
a second register including $0^{th}$ to $2t^{th}$ storage areas;
a Galois field division unit configured to perform a Galois field division such that a coefficient stored in the $2t^{th}$ storage area of said second register is Galois-field-divided by the coefficient stored in the $2t^{th}$ storage area of said first register;
a group of Galois field multiplication units configured to perform Galois field multiplications such that a result of the division of said Galois field division unit is Galois-field-multiplied by the 0th to $(2t-1)^{th}$ coefficients of said first register to obtain respective multiplied coefficients;
a group of Galois field addition units configured to perform Galois field additions such that respective ones of the obtained multiplied coefficients are Galois-field-added to respective ones of coefficients stored in the $0^{th}$ to $(2t-1)^{th}$ storage areas of said second register to output resulting coefficients of the Galois field additions;
a first selector configured to select, as output coefficients thereof, either the resulting coefficients outputs from said group of Galois field addition units or the coefficients stored in said first register;
a shifter configured to shift the output coefficients of said first selector to be stored in predetermined storage areas of said first register or predetermined storage areas of said second register;
an insertion unit configured to substitute with zero or delete one of the output coefficients of said first selector to output zero-inserted coefficients; and
a second selector configured to store the shifted output coefficients of said first selector into one of said first register and said second register, and to store the zero-inserted coefficients from said insertion unit into the other of said first register and said second register,
wherein coefficients of the error locator polynomial are a result of repeated calculations performed by said Galois field division unit, said group of Galois field multiplication units and said group of Galois field addition units.

2. A processing module as defined in claim 1, wherein said shifter shifts the Galois-field-added $0^{th}$ to $(2t-1)^{th}$ coefficients of said second register or the $0^{th}$ to $(2t-1)^{th}$ coefficients of said first register, to be stored in the $1^{st}$ to $2t^{th}$ storage areas of said first register or the $1^{st}$ to $2t^{th}$ storage areas of said second register.

3. A processing module as defined in claim 1, wherein at an $i^{th}$ repetition among repetitions of the repeated calculations, where i denotes an integer among one to 2t, said insertion unit is configured to input either the coefficients of said first register or the coefficients of said second register, alter the inputted coefficients such that the coefficient corresponding to the $i^{th}$ storage area is changed to zero, and store the altered coefficients in one of said first register and said second register.

4. A processing module as defined in claim 1, wherein:
the number of repetitions of the repeated calculations performed by said Galois field division unit, said group of Galois field multiplication units and said group of Galois field addition units is 2t; and
among resulting coefficients of said group of Galois field addition units after 2t repetitions, or among coefficients stored in said first register after 2t repetitions, coefficients in a number corresponding to a degree of the error locator polynomial are outputted as the coefficients of the error locator polynomial.

5. A processing module as defined in claim 4, wherein among coefficients stored in said first register after the 2t repetitions, coefficients stored in the $2t^{th}$ to $t^{th}$ storage areas are outputted as the coefficients of the error locator polynomial.

6. A processing module as defined in claim 1, further comprising a control unit configured to control said first and second selectors wherein:

said control unit controls said first and second selectors to output the coefficients of said first register to said insertion unit, to store the outputs from said insertion unit in said first register, to feed said shifter with the resulting coefficients of said group of Galois field addition units, and to store outputs from said shifter, corresponding to the resulting coefficients of said group of Galois field addition units, in said second register, when a remainder polynomial at a current repetition is to be substituted by a dividend polynomial at a next repetition, and said control unit controls said first and second selectors to output the coefficients of said first register to said insertion unit, to store the outputs from said insertion unit in said second register, to feed said shifter with the resulting coefficients of said group of Galois field addition units, and to store the outputs from said shifter, corresponding to the resulting coefficients of said group of Galois field addition units, in said first register, when the remainder polynomial and a divisor polynomial at the current repetition are to be substituted by the divisor polynomial and the dividend polynomial at the next repetition.

7. A processing module as defined in claim 6, wherein: said control unit controls said first and second selectors to output the coefficients of said first register to said shifter, to store the outputs from said shifter in said first register, to output the coefficients of said second register to said insertion unit, and to store the outputs from said insertion unit in said second register, when the coefficient of the $2t^{th}$ storage area of said first transistor is zero, and said shifter shifts the coefficients from the $0^{th}$ to $(2t-1)^{th}$ storage areas of said first register to be stored in the first $1^{st}$ to $2t^{th}$ storage areas of said first register.

8. A processing module as defined in claim 1, wherein said Galois field division unit includes:

an inverse element memory configured to store coefficients and inverse elements thereof in association; and a further Galois field multiplication unit configured to multiply an inverse element read out from said inverse element memory based on a coefficient inputted from the $2t^{th}$ storage area of said first register, and a coefficient inputted from the $2t^{th}$ storage area of said second register.

9. An error correction decoding circuit, in which error corrections of t words are performed using an error locator polynomial of a BCH code, where t denotes a predetermined integer, the error correction decoding circuit comprising:

a syndrome calculation unit configured to obtain a syndrome polynomial from an input signal;

a processing module configured to obtain an error locator polynomial; and an error correction unit configured to correct an error of the input signal on the basis of a coefficient of the error locator polynomial obtained by said processing module;

wherein said processing module includes:

a first register including $0^{th}$ to $2t^{th}$ storage areas, and in which coefficients of the syndrome polynomial obtained by said syndrome calculation unit being stored in the $1^{st}$ to $2t^{th}$ storage areas of the first register;

a second register including $0^{th}$ to $2t^{th}$ storage areas;

a Galois field division unit configured to perform a Galois field division such that a coefficient stored in the $2t^{th}$ storage area of said second register, is Galois-field-divided by the coefficient stored in the $2t^{th}$ storage area of said first register;

a group of Galois field multiplication units configured to perform a Galois field multiplication such that a result of the division of said Galois field division unit is Galois-field-multiplied the $0^{th}$ to $(2t-1)^{th}$ coefficients of said first register to obtain respective multiplied coefficients;

a group of Galois field addition units configured to perform Galois field additions such that respective ones of the obtained multiplied coefficients are Galois-field added to respective ones of coefficients stored in the $0^{th}$ to $(2t-1)^{th}$ storage areas of said second register to output resulting coefficients of the Galois field additions;

a first selector configured to select, as output coefficients thereof, either the resulting coefficients outputs from said group of Galois field addition units or the coefficients stored in said first register;

a shifter which configured to shift the coefficients of said first selector, to be stored in predetermined storage areas of said first register or predetermined storage areas of said second register;

an insertion unit configured to substitute with zero or deletes one of the output coefficients of said first selector to output zero-inserted coefficients; and a second selector configured to store the shifted output coefficients of said first selector into one of said first register and said second register, and to store the zero-inserted coefficients from said insertion unit into the other of said first register and said second register, wherein coefficients of the error locator polynomial are a result of repeated calculations performed by said Galois field division unit, said group of Galois field multiplication units and said group of Galois field addition units, and are outputted to said error correction unit.

10. An error correction decoding circuit as defined in claim 9, further comprising:

a plurality of syndrome calculation units, each being configured in the same manner as said syndrome calculation unit; and a plurality of error correction units, each being configured in the same manner as said error correction unit;

wherein said processing module is configured to input syndrome polynomials from the plurality of syndrome calculation units, and output obtained error locator polynomials to the plurality of error correction units corresponding to the plurality of syndrome calculation units.

11. A processing method for obtaining an error locator polynomial of a BCH code for performing error corrections oft words with the error locator polynomial, where t denotes a predetermined integer, the method including comprising:

a Galois field division step of:

inputting, from a second register including $0^{th}$ to $2t^{th}$ storage areas, a first coefficient stored in the $2t^{th}$ storage area of the second register, inputting, from a first register including $0^{th}$ to $2t^{th}$ storage areas, in which coefficients of a syndrome polynomial are initially stored in the $1^{st}$ to $2t^{th}$ storage areas, a second coefficient stored in the $2t^{th}$ storage area of the first register, and Galois-field-dividing the first coefficient by the second coefficient;

a Galois field multiplication step of Galois-field-multiplying a result of the division of said Galois field division step and respective ones of the $0^{th}$ to $(2t-1)^{th}$ coefficients of the first register to obtain multiplied coefficients;

a Galois field addition step of Galois-field-adding respective ones of the obtained multiplied coefficients to respective ones of coefficients stored in $0^{th}$ to $(2t-1)^{th}$ storage areas of the second register to output resulting coefficients of the Galois field addition step;

a shift step of shifting the resulting coefficients of said Galois field addition step or the $0^{th}$ to $(2t-1)^{th}$ coefficients of the first register to output shifted coefficients so as to be stored in predetermined storage areas of the first register or predetermined storage areas of the second register;

an insertion step of substituting with zero or deleting one of the coefficients stored in the first register or one of the coefficients stored in the second register; and a storage step of storing a processed result of said shift step into one of the first register and the second register, and storing a processed result of said insertion step into the other of the first register and the second register;

wherein coefficients of the error locator polynomial are obtained by repeating steps which include said Galois field division step, said Galois field multiplication step and said Galois field addition step.

* * * * *